and title page

United States Patent
Noto et al.

(10) Patent No.: US 7,119,319 B2
(45) Date of Patent: Oct. 10, 2006

(54) SOLID-STATE IMAGE SENSING ELEMENT AND ITS DESIGN SUPPORT METHOD, AND IMAGE SENSING DEVICE

(75) Inventors: Goro Noto, Tokyo (JP); Yasuo Suda, Yokohama (JP); Akihiko Nagano, Ichihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 49 days.

(21) Appl. No.: 11/099,447

(22) Filed: Apr. 6, 2005

(65) Prior Publication Data

US 2005/0236553 A1  Oct. 27, 2005

(30) Foreign Application Priority Data

| Apr. 8, 2004 | (JP) | ............................. 2004-114360 |
| Jul. 16, 2004 | (JP) | ............................. 2004-210379 |
| Jul. 22, 2004 | (JP) | ............................. 2004-214617 |

(51) Int. Cl.
*H01L 27/00* (2006.01)
*H01L 31/00* (2006.01)

(52) U.S. Cl. ................ 250/208.1; 250/216; 250/214.1; 348/335

(58) Field of Classification Search ............ 250/208.1, 250/216, 214.1; 348/335
See application file for complete search history.

(56) References Cited

U.S. PATENT DOCUMENTS

| 4,698,492 A | 10/1987 | Ohtaka et al. ............... 250/201 |
| 4,745,426 A | 5/1988 | Suda et al. .................. 354/407 |
| 4,777,506 A | 10/1988 | Hiramatsu et al. .......... 354/408 |
| 4,856,869 A | 8/1989 | Sakata et al. .......... 350/162.18 |
| 4,914,282 A | 4/1990 | Akashi et al. ........... 250/201.8 |
| 5,053,803 A | 10/1991 | Suda et al. ................. 354/466 |
| 5,130,740 A | 7/1992 | Suda et al. ................. 354/479 |
| 5,182,443 A | 1/1993 | Suda et al. .............. 250/201.2 |

(Continued)

FOREIGN PATENT DOCUMENTS

JP  1-213079  8/1989

(Continued)

*Primary Examiner*—Thanh X. Luu
*Assistant Examiner*—Stephen Yam
(74) *Attorney, Agent, or Firm*—Fitzpatrick, Cella, Harper & Scinto

(57) ABSTRACT

A solid-state image sensing element has a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide. The solid-state image sensing element located at a distance (H) satisfies:

$$\frac{H \cdot D}{L \cdot P} < a \cdot \frac{N_H}{N_L} \text{ for } 0 < a < 1$$

where L is the distance from an exit pupil of an image sensing optical system of an image sensing device, which mounts an image sensor formed by two-dimensionally arranging a plurality of the solid-state image sensing elements, H is the distance from a center of the image sensor to a position of the solid-state image sensing element on the image sensor, D is the height from the photoelectric conversion element to an apex of the microlens, P is the spacing between the plurality of solid-state image sensing elements, $N_H$ is the refractive index of the light guide, and $N_L$ is the refractive index of the insulating interlayer.

20 Claims, 32 Drawing Sheets

U.S. PATENT DOCUMENTS

| | | |
|---|---|---|
| 5,245,371 A | 9/1993 | Nagano et al. ............... 354/62 |
| 5,451,766 A * | 9/1995 | Van Berkel .............. 250/208.1 |
| 5,485,241 A | 1/1996 | Irie et al. .................... 354/410 |
| 5,561,289 A | 10/1996 | Yamada et al. ............. 250/221 |
| 5,579,080 A | 11/1996 | Irie et al. ...................... 396/51 |
| 5,600,399 A | 2/1997 | Yamada et al. ............... 396/51 |
| 5,610,390 A * | 3/1997 | Miyano ...................... 250/216 |
| 5,610,681 A | 3/1997 | Nagano et al. ............... 396/51 |
| 5,634,141 A | 5/1997 | Akashi et al. ................ 396/51 |
| 5,708,862 A | 1/1998 | Tsunekawa et al. ........... 396/51 |
| 5,734,428 A | 3/1998 | Suda et al. ................. 348/341 |
| 5,752,090 A | 5/1998 | Nagano et al. ............... 396/51 |
| 5,761,543 A | 6/1998 | Yamada et al. ............... 396/51 |
| 5,797,046 A | 8/1998 | Nagano et al. ............... 396/51 |
| 5,970,258 A | 10/1999 | Suda et al. .................... 396/51 |
| 5,983,030 A | 11/1999 | Nagano ....................... 396/51 |
| 6,047,139 A | 4/2000 | Suda .......................... 396/296 |
| 6,091,899 A | 7/2000 | Konishi et al. ............... 396/51 |
| 6,112,029 A | 8/2000 | Suda ........................... 396/92 |
| 2004/0155976 A1 | 8/2004 | Suda .......................... 348/345 |

FOREIGN PATENT DOCUMENTS

| | | |
|---|---|---|
| JP | 5-283661 | 10/1993 |
| JP | 8-223587 | 8/1996 |
| JP | 2000-324505 | 11/2000 |
| JP | 2002-83948 | 3/2002 |
| JP | 2002-141488 | 5/2002 |
| JP | 2003-163826 | 6/2003 |

* cited by examiner

F I G. 4
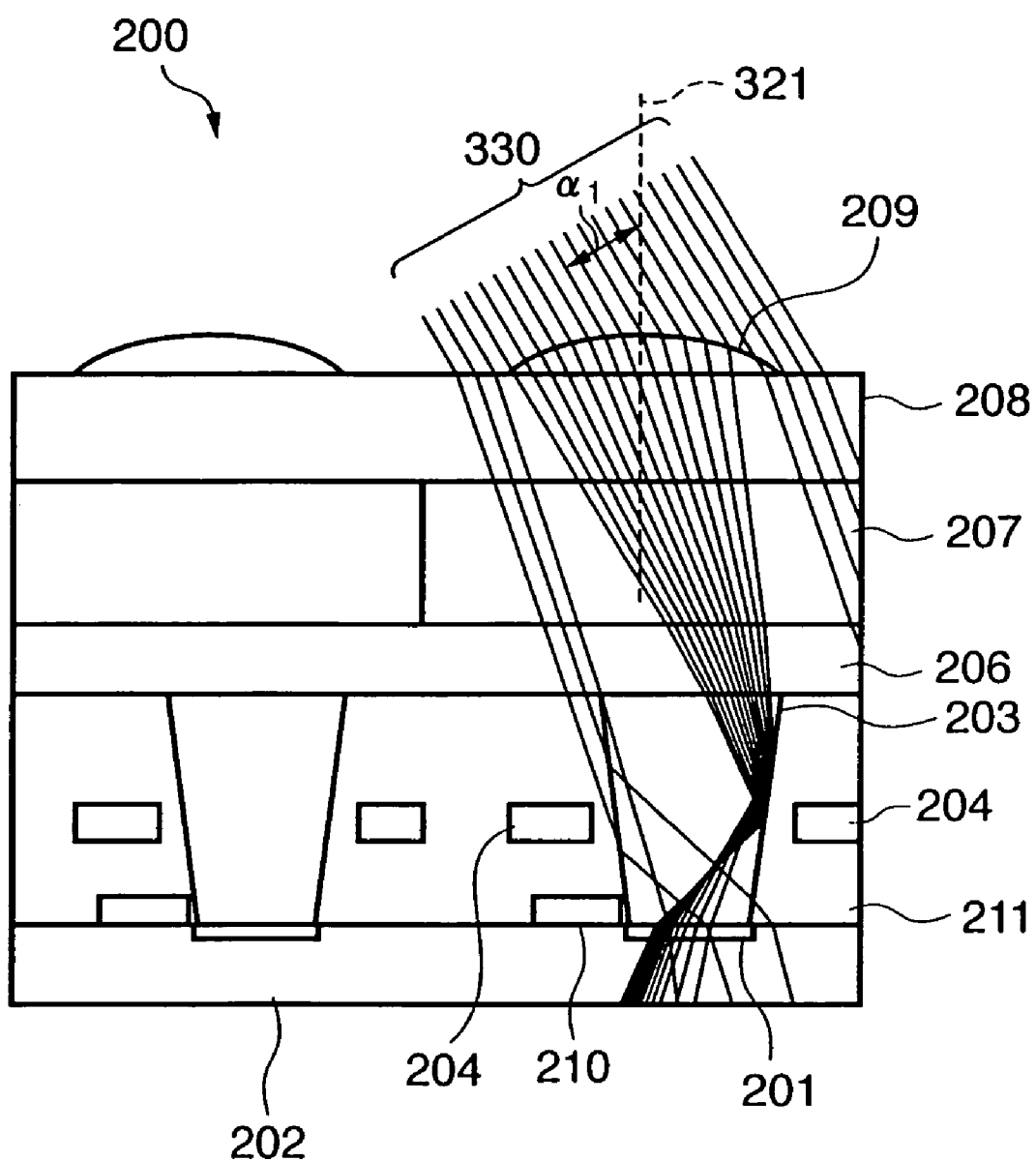

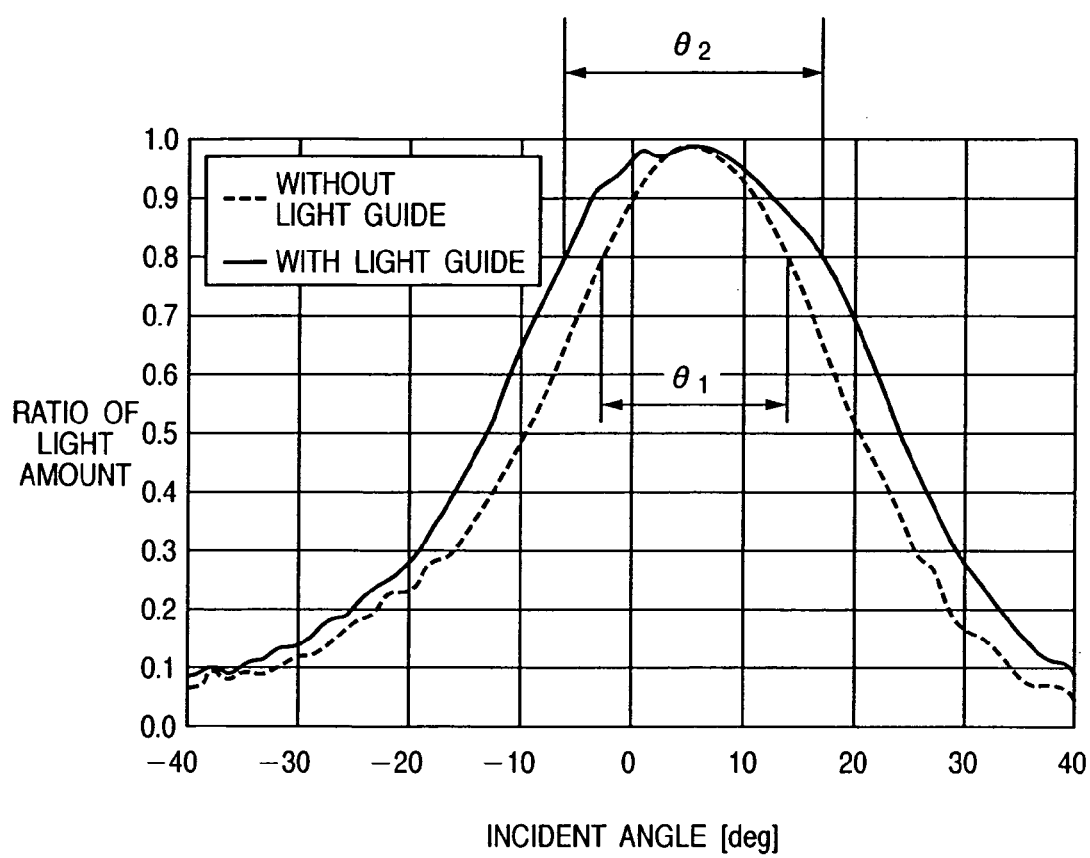

FIG. 7A
FIG. 7B
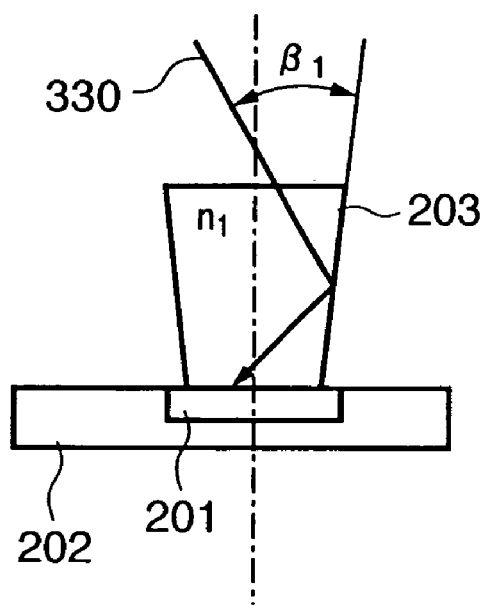
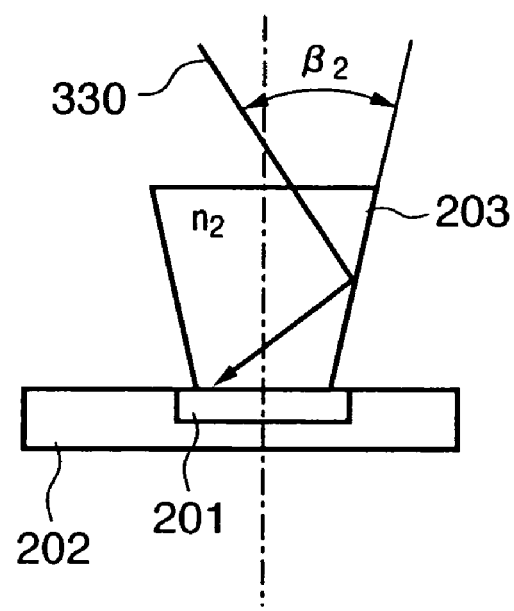

SOLID-STATE IMAGE SENSING ELEMENT AND ITS DESIGN SUPPORT METHOD, AND IMAGE SENSING DEVICE

FIELD OF THE INVENTION

The present invention relates to an image sensing device having a zoom function and focus adjustment function in an image sensing optical system, a lens-exchangeable image sensing device, a solid-state image sensing element used in the image sensing device and its design support method, and a device.

BACKGROUND OF THE INVENTION

In recent years, solid-state image sensing elements mainly used in digital still cameras and the like are roughly classified into a CCD (Charge-Coupled Device) and CMOS (Complementary Metal Oxide Semiconductor) (e.g., see Japanese Patent Laid-Open Nos. 2002-141488 and 2002-083948).

Principal components of the structure of the CCD will be briefly explained first with reference to FIG. 28.

FIG. 28 is a sectional view of one pixel of a CCD 1000. Referring to FIG. 28, reference numeral 1001 denotes a semiconductor substrate formed of, e.g., silicon; 1002, a photoelectric conversion element including a photodiode; 1003, an oxide film formed on the semiconductor substrate 1001; 1004, three wiring layers which are formed of polysilicon or the like and transmit clock signals used to transfer a charge and the like converted by the photoelectric conversion element 1002; 1006, a light-shielding layer which is formed of tungsten or the like and shields from light a vertical CCD register 1005, used for charge transfer, mainly formed under the wiring layers 1004; 1007, a first protection film which is formed of $SiO_2$ or the like and protects the photoelectric conversion element 1002 and the like from external air ($O_2$, $H_2O$), impurity ions ($K^+$, $Na^+$), and the like; and 1008, a second protection film formed of an SiON-based material or the like. Reference numeral 1009 denotes a flattening layer which is formed of an organic material and reduces the unevenness of the second protection film 1008; and 1010, a microlens for focusing light from an object onto the photoelectric conversion element 1002.

The flattening layer 1009 reduces the unevenness of a principal surface 1011 of the CCD 1000, and also serves to adjust the focal length of the microlens 1010 so as to form a focal point of the microlens 1010 on the photoelectric conversion element 1002. Hence, the thickness of the flattening layer 1009 made up of a transparent photosensitive resin is determined by the curvature of the lens and the refractive index of the lens material.

Principal components of the structure of the CMOS will be briefly described below using FIG. 29.

FIG. 29 is a sectional view of one pixel of a CMOS 1050. Referring to FIG. 29, reference numeral 1051 denotes a silicon substrate (Si substrate), on which a photoelectric conversion unit 1052 serving as a photoelectric conversion element (e.g., a photodiode or the like) is formed. Reference numeral 1054 denotes an insulating interlayer formed of $SiO_2$ or the like; and 1053, a transfer electrode which is formed in the insulating interlayer 1054, and is used to transfer a photo charge generated by the photoelectric conversion unit 1052 to a floating diffusion (FD) unit (not shown). Reference numeral 1055 denotes wiring electrodes which are formed to prevent light from entering portions other than the photoelectric conversion unit 1052 and have a light-shielding effect; 1056, a flattening layer which is formed on a somewhat bumpy surface due to electrodes and wiring layers (not shown) to provide a flat surface; 1057, a color filter of, e.g., red, green, or blue; and 1059, a microlens. The microlens 1059 is formed on the flattening layer 1058. The shape of the microlens 1059 is determined to focus a light beam coming from an image sensing lens (not shown) onto the photoelectric conversion unit 1052.

An image sensing system (zoom mechanism) of a digital camera with the aforementioned solid-state image sensing element will be described below.

FIG. 30 is a schematic sectional view of an image sensing system 1100 of a compact type digital camera. Referring to FIG. 30, reference numeral 1101 denotes a first lens group; 1102, a second lens group; and 1103, a third lens group. The first and second lens groups 1101 and 1102 are movable in the optical axis direction within predetermined ranges for zooming, and the third lens group 1103 is movable in the optical axis direction within a predetermined range for focus adjustment. Reference numeral 1104 denotes an optical low-pass filter; and 1105, an image sensor using a solid-state image sensing element such as a CCD, CMOS, or the like. Reference numeral 1106 denotes a stop, whose aperture size is changed by a driving source 1107.

Reference numeral 1110 denotes a holding member of the first lens group 1101; 1111, a guide pin that guides movement of the first lens group 1101 in the optical axis direction; 1120, a holding member of the second lens group; and 1121, a guide pin that guides movement of the second lens group 1102 in the optical axis direction.

Reference numeral 1130 denotes a cam cylinder which has a cam groove 1131 for moving the first lens group 1101 in the optical axis direction, and a cam groove 1132 for moving the second lens group 1102 in the optical axis direction. The cam cylinder 1130 is movable within a predetermined range in the optical axis direction. Note that the guide pin 1111 cam-fits into the cam groove 1131, and the guide pin 1121 cam-fits into the cam groove 1132. Reference numeral 1133 denotes a guide pin which guides movement of the cam cylinder 1130 in the optical axis direction, and cam-fits into a cam groove 1141 formed in a cam cylinder 1140.

When the cam cylinder 1140 rotates by a driving source (not shown), the cam cylinder 1130 moves in the optical axis direction. As a result, the first and second lens groups 1101 and 1102 move by predetermined amounts in the optical axis direction while being guided by the cam grooves 1131 and 1132 formed in the cam cylinder 1130. With this movement, zooming of the image sensing system 1100 is attained.

Reference numeral 1150 denotes a holding member of the third lens group 1103; and 1160, a holding member of the optical low-pass filter 1104 and image sensor 1105. The holding member 1160 axially supports a motor 1161 to be rotatable. A male screw 1162 is integrally formed on the motor 1161. Since the male screw 1162 is threadably coupled to a female screw 1163 held by the holding member 1150, the holding member 1150 moves along a guide bar (not shown) within a predetermined range in the optical axis direction upon rotation of the motor 1161, i.e., the male screw 1162. In this manner, focus adjustment of the image sensing system 1100 by the third lens group 1103 is attained.

FIG. 31 is a schematic view of a lens-exchangeable digital still camera. FIG. 31 depicts an example of a camera system in which a tele-photo lens 1120 is mounted on a camera body 1200.

The camera body 1200 and tele-photo lens 1220 are coupled via a camera-side mount 1211 and lens-side mount

1221. An electrical circuit such as a lens MPU and the like (not shown) provided to the tele-photo lens 1220 is coupled to an electrical circuit such as a camera MPU and the like (not shown) via a lens-side contact 1222 and camera-side contact 1212.

When a photographer observes an object via a viewfinder, some light components of object light transmitted through the tele-photo lens 1220 are reflected by a quick return mirror 1201 and reach a focusing screen 1202. The object light scattered and transmitted through the focusing screen 1202 is guided to the photographer's eye (not shown) via a pentaprism 1203 and eyepiece 1204.

Also, some light components of the object light are transmitted through the quick return mirror 1201, are reflected by a sub mirror 1205, and are guided to a focus detection unit 1206. The camera MPU calculates a focus adjustment amount of the tele-photo lens 1220 on the basis of an image signal obtained by the focus detection unit 1206, and drives a lens 1223 of the tele-photo lens 1220.

Upon sensing an image, the quick return mirror 1201 and sub mirror 1205 rotate in the direction of the focusing screen 1202, and allow object light transmitted through the tele-photo lens 1220 to be incident on to an image sensor 1208. Since the exit pupil position varies depending on the focal length and the like of an exchangeable lens mounted on the camera body 1200, a light beam that can be received by pixels of, especially, a peripheral portion of the image sensor 1208 changes depending on the exchangeable lens mounted.

Light rays obliquely enter pixels of the periphery of a frame of the image sensor 1208. At this time, as disclosed in Japanese Patent Laid-Open No. 1-213079, if each microlens decenters with respect to the photoelectric conversion unit, it can guide light rays to the photoelectric conversion unit. However, when the condition of the exit pupil of the image sensing lens changes, light rays cannot enter the photoelectric conversion unit and the frame periphery often becomes dark. Such phenomenon conspicuously occurs when the pixel size is reduced. Especially, when an image sensing lens that has a zoom function and focus adjustment function is used, the phenomenon poses severe bottlenecks.

Hence, in an image sensing device that uses an image sensing element comprising an on-chip microlens (Japanese Patent Laid-Open No. 2000-324505), gain control is applied for respective color components of an image signal in accordance with lens information of an exchangeable lens and the distance from the center of an image sensing surface, thus correcting deterioration of sensitivity and variations of hue due to shading and limb darkening. By applying gain control for respective color components using information associated with the exit pupil position of an image sensing lens, shading can be eliminated.

Japanese Patent Laid-Open No. 5-283661 discloses a solid-state image sensing device which includes a light guide between a photo-receiving unit and focusing lens. The light guide of that solid-state image sensing device is formed of a material with a high refractive index, and light that has entered the light guide is guided to the photo-receiving unit while being totally reflected within the light guide, thus improving the focusing characteristics.

Japanese Patent Laid-Open No. 2003-163826 discloses a technique associated with shading correction information of an image sensing system including an exchangeable lens. Vignetting data and exit pupil position data are stored on the exchangeable lens side, and incident-angle dependent data of an image sensing element output are stored on the camera body side, thus realizing shading correction that reflects the characteristics of both the exchangeable lens and camera body.

Japanese Patent Laid-Open No. 8-223587 is an example of disclosure of a technique that pertains to color correction means for preventing a hue change of an image due to chromatic aberration of an on-chip microlens. A change in hue of an image due to a change in size of a focusing spot of the exit pupil projected onto the photoelectric conversion unit of the image sensing element depending on the wavelength of light is eliminated using a color correction means that corrects the ratio of color stimulus values of an image signal in accordance with the exit pupil position of an image sensing lens.

However, the shading correction and color correction techniques disclosed in Japanese Patent Laid-Open Nos. 2000-324505, 2003-163826 and 8-223587 basically electrically correct an image signal on the basis of the exit pupil position of an image sensing lens. However, boosting a signal level to an appropriate level by applying electrical gain is to enhance not only signal components but also noise components, resulting in a low-quality image in which noise is conspicuous on the darkening-corrected peripheral portion.

In case of the conventional compact digital camera, the type of its image sensing system is limited. Such limitation will be explained below using FIG. 32.

FIG. 32 shows a case wherein an object light beam 1061 enters the CMOS 1050 as the conventional solid-state image sensing element at a given tilted incident angle (20° with respect to a central axis 1060 of the microlens 1059 in FIG. 32). In this case, most light components of the object light beam 1061 transmitted through the microlens 1059 do not enter the photoelectric conversion unit 1052. The same applies to the CCD 1000 as the solid-state image sensing element.

That is, there must be a given limitation on an angle that the object light beam 1061 which exits the image sensing system and enters the microlens 1010 or 1059 makes with the central axis of the microlens 1010 or 1059 (to be referred to as an incident angle of an object light beam hereinafter). The object light beam 1061 must enter the microlens at an angle of 10° or less. In case of the image sensing system 1100 described in FIG. 30, the incident angle of the object light beam 1061 falls within the range from 3 to 9 by zooming.

That is, in case of the compact digital camera using the conventional solid-state image sensing element, since its image sensing system is limited to a retrofocus system, the degree of freedom in design of the image sensing system drops, and a size reduction of the image sensing system is disturbed.

In order to solve this problem, even when the compact digital camera or lens-exchangeable camera system is formed using the solid-state image sensing device having the light guide disclosed in Japanese Patent Laid-Open No. 5-283661 above, the light guide cannot often cause total reflection depending on the exit pupil position of the image sensing system of the compact digital camera or the exchangeable lens mounted on the camera. As a result, light cannot be sufficiently collected on the photoelectric conversion unit.

An image capture device disclosed in Japanese Patent Laid-Open No. 2000-324505 performs gain adjustment of an image signal on the basis of exchangeable lens information. However, when limb darkening due to the exchangeable lens is large and the output of the image sensing element is small, gain adjustment must be done at a higher gain. As a result, noise components are also amplified, and a high-quality image signal cannot be obtained.

SUMMARY OF THE INVENTION

The present invention has been made in consideration of the above situation, and has as its first object to provide a solid-state image sensing element which can improve the degree of freedom in design of an image sensing system in an image sensing device, and has high light collecting efficiency according to each image sensing device.

It is the second object of the present invention to obtain a high-quality image by improving the light collecting efficiency of an image sensing element in an image sensing device having an image sensing lens with a zoom function or focus adjustment function.

It is the third object of the present invention to realize a digital camera system which can obtain a high-quality image and can obtain a high-resolution image by reducing the size of each pixel in a lens-exchangeable digital camera system.

According to the present invention, the foregoing first object is attained by providing a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, wherein the solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of the solid-state image sensing elements, H is a distance from a center of the image sensor to a position of the solid-state image sensing element on the image sensor, D is a height from the photoelectric conversion element to an apex of the microlens, P is a spacing between the plurality of solid-state image sensing elements, $N_H$ is a refractive index of the light guide, and $N_L$ is a refractive index of the insulating interlayer.

Further, according to the present invention, a design support method for supporting to design a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprises: a condition acquisition step of acquiring at least some of conditions including a distance L from an exit pupil of an image sensing optical system of an image sensing device, which mounts an image sensor formed by two-dimensionally arranging a plurality of the solid-state image sensing elements, a distance H from a center of the image sensor to a position of the solid-state image sensing element on the image sensor, a height D from the photoelectric conversion element to an apex of the microlens, a spacing P between the plurality of solid-state image sensing elements, a refractive index $N_H$ of the light guide, and a refractive index $N_L$ of the insulating interlayer; a determination step of determining if all the conditions can be acquired in the condition acquisition step; a calculation step of computing, when it is determined in the determination step that all the conditions can be acquired, $$\frac{H \cdot D}{L \cdot P} < a \cdot \frac{N_H}{N_L}$$

and calculating a; a computing step of computing, when it is determined in the determination step that all the conditions cannot be acquired, a value which satisfies 0<a<1 for a condition which cannot be acquired; and a notifying step of notifying the calculated a value or the value computed in the computing step.

Further, the foregoing first object is also attained by providing a design support apparatus for supporting to design a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprising: a condition acquisition unit that acquires at least some of conditions including a distance L from an exit pupil of an image sensing optical system of an image sensing device, which mounts an image sensor formed by two-dimensionally arranging a plurality of the solid-state image sensing elements, a distance H from a center of the image sensor to a position of the solid-state image sensing element on the image sensor, a height D from the photoelectric conversion element to an apex of the microlens, a spacing P between the plurality of solid-state image sensing elements, a refractive index $N_H$ of the light guide, and a refractive index $N_L$ of the insulating interlayer; a determination unit that determines if all the conditions can be acquired by the condition acquisition unit; a computing unit that computes, when the determination unit determines that all the conditions can be acquired, $$\frac{H \cdot D}{L \cdot P} < a \cdot \frac{N_H}{N_L}$$

and calculates a, and that computes, when the determination unit determines that all the conditions cannot be acquired, a value which satisfies 0<a<1 for a condition which cannot be acquired; and a notifying unit that notifies the calculated a value or the value computed by the computing unit.

Further, the foregoing second object is attained by providing a solid-state image sensing element comprising: a photoelectric conversion element which converts incoming light into an electrical signal in accordance with an amount of the light; a microlens which is arranged on an incident surface; a light guide which is arranged between the photoelectric conversion element and the microlens, and is formed of a composite material prepared by dispersing in resin one of titanium oxide ($TiO_2$), silicon nitride ($Si_3N_4$), and niobium pentoxide ($Nb_2O_5$); and an insulating interlayer which is arranged around the light guide and is formed of hydrophobic porous silica, wherein the solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of the solid-state image sensing elements, H is a distance from a center of the image sensor to a position of the solid-state image sensing element on the image sensor, D is a height from the photoelectric conversion element to an apex of the microlens, P is a spacing between the plurality of solid-state image sensing elements, $N_H$ is a refractive index of the light guide, and $N_L$ is a refractive index of the insulating interlayer.

Further, the foregoing second object is also attained by providing a solid-state image sensing element comprising: a photoelectric conversion element which converts incoming light into an electrical signal in accordance with an amount of the light; a microlens which is arranged on an incident surface; a light guide which is arranged between the photoelectric conversion element and the microlens, and is formed of a material selected from silicon nitride ($Si_3N_4$) and silicon oxynitride (SiON); and an insulating interlayer which is arranged around the light guide and is formed of silicon oxide ($SiO_2$), wherein the solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of the solid-state image sensing elements, H is a distance from a center of the image sensor to a position of the solid-state image sensing element on the image sensor, D is a height from the photoelectric conversion element to an apex of the microlens, P is a spacing between the plurality of solid-state image sensing elements, $N_H$ is a refractive index of the light guide, and $N_L$ is a refractive index of the insulating interlayer.

Furthermore, the foregoing second object is also attained by providing a solid-state image sensing element comprising: a photoelectric conversion element which converts incoming light into an electrical signal in accordance with an amount of the light; a microlens which is arranged on an incident surface; a light guide which is arranged between the photoelectric conversion element and the microlens, and is formed of silicon oxide ($SiO_2$); and an insulating interlayer which is arranged around the light guide and is formed of hydrophobic porous silica, wherein the solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of the solid-state image sensing elements, H is a distance from a center of the image sensor to a position of the solid-state image sensing element on the image sensor, D is a height from the photoelectric conversion element to an apex of the microlens, P is a spacing between the plurality of solid-state image sensing elements, $N_H$ is a refractive index of the light guide, and $N_L$ is a refractive index of the insulating interlayer.

Furthermore, the foregoing third object is attained by providing an image sensing apparatus which has a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprising: an attachment/detachment unit that allows an exchangeable lens to attach/detach to/from the image sensing apparatus, wherein the solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of the solid-state image sensing elements, H is a distance from a center of the image sensor to a position of the solid-state image sensing element on the image sensor, D is a height from the photoelectric conversion element to an apex of the microlens, P is a spacing between the plurality of solid-state image sensing elements, $N_H$ is a refractive index of the light guide, and $N_L$ is a refractive index of the insulating interlayer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a ray-tracing diagram of the solid-state image sensing element shown in FIG. 3;

FIG. 6 is a graph showing the photo-receiving efficiency with respect to the incident angle of an object light beam onto the solid-state image sensing element;

FIGS. 7A and 7B are views for explaining the relationship among the refractive index, critical angle, and opening of a light guide;

DETAILED DESCRIPTION OF THE PREFERRED EMBODIMENTS

Preferred embodiments of the present invention will be described in detail in accordance with the accompanying drawings. However, the dimensions, materials, shapes and relative positions of the constituent parts shown in the embodiments should be changed as convenient depending on various conditions and on the structure of the apparatus adapted to the invention, and the invention is not limited to the embodiments described herein.

<First Embodiment>

Figure 1:
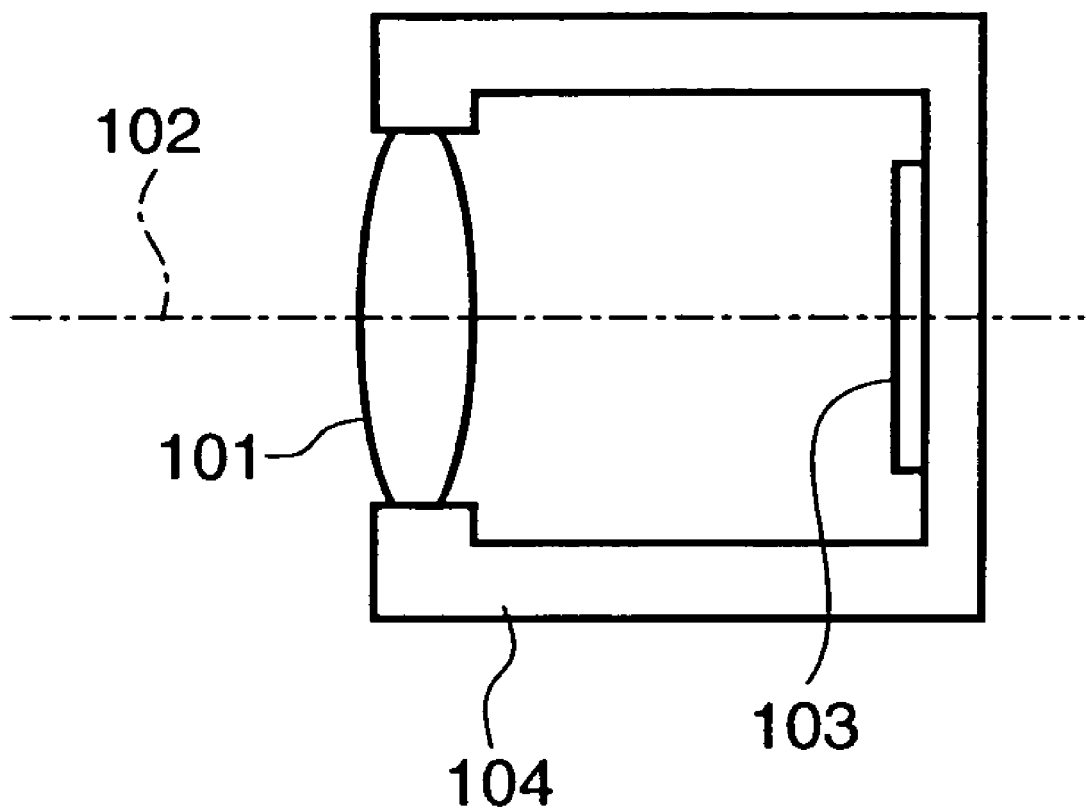
FIG. 1 is a sectional view showing the concept of an image sensing device.

FIG. 1 is a sectional view showing the concept of the arrangement of an image sensing device such as a digital still camera system and the like. Referring to FIG. 1, reference numeral 101 denotes a convex lens as an imaging optical system; 102, an optical axis of the imaging optical system 101; 103, an image sensor for converting an object light image formed by the imaging optical system into an electrical signal; and 104, a housing that holds the imaging optical system 101 and image sensor 103, and has a function as a camera obscura. Note that the imaging optical system 101 is illustrated as a single lens (convex lens) for the descriptive convenience. In practice, the imaging optical system can be an imaging optical system having positive power by combining a plurality of lenses, reflecting mirrors, or diffraction imaging optical systems. Also, a zoom function may be applied. Furthermore, the imaging optical system 101 may have a stop for light shielding that cuts ghost and flare.

The image sensor 103 comprises a plurality of solid-state image sensing elements. For example, the image sensor 103 is formed by regularly and two-dimensionally arranging several million solid-state image sensing elements in the vertical and horizontal directions or oblique directions so as to obtain image data for several million pixels.

Figure 2:
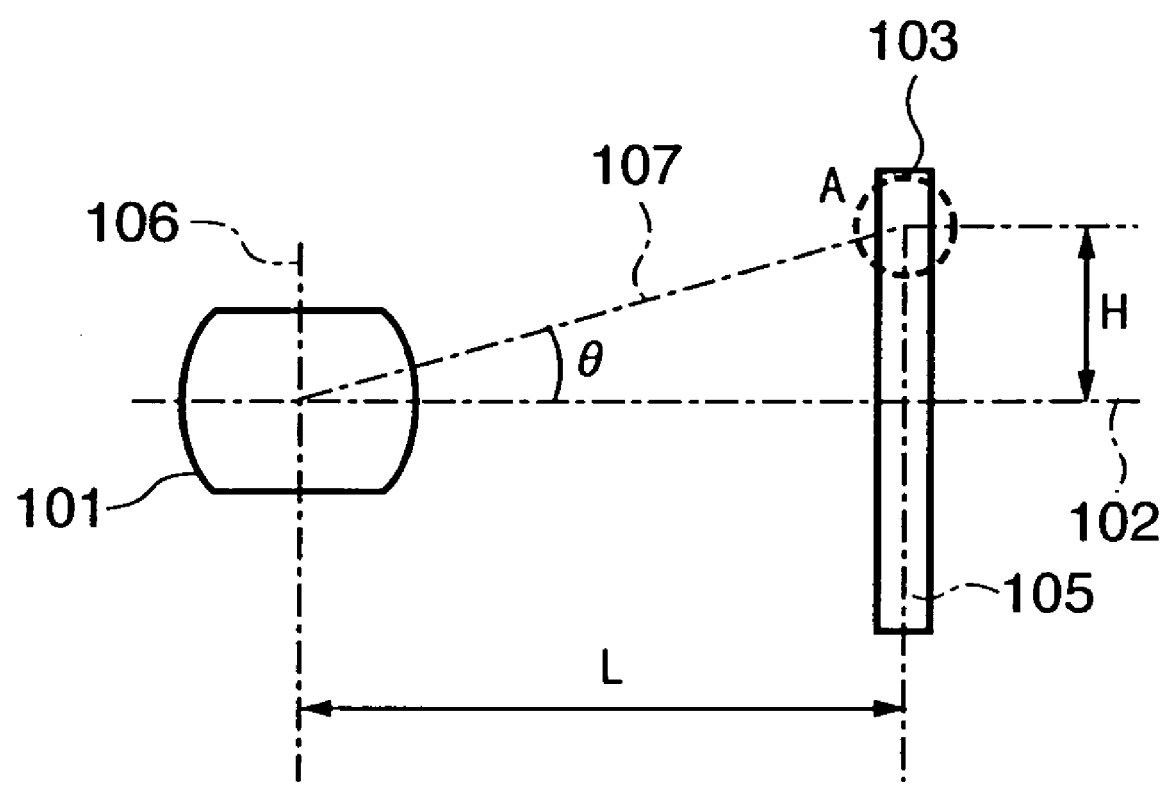
FIG. 2 is an explanatory view showing the positional relationship between an image sensing optical system and image sensor.

FIG. 2 is an explanatory view showing the positional relationship between the image sensing optical system 101 and image sensor 103. Referring to FIG. 2, the image sensor 103 has a photo-receiving surface 105 on which an object light beam focuses via the imaging sensing optical system 101. Let L be the distance between the imaging sensing optical system 101 and the photo-receiving surface 105 of the image sensor 103 in the direction of the optical axis 102 (to be referred to as a "pupil distance" hereinafter), and H be the distance from the optical axis 102 to the outermost periphery of the photo-receiving surface 105. Therefore, the distance H corresponds to the image height. Also, let θ be an angle a chief ray 107 makes with the optical axis 102, the chief ray 107 emerging from an intersection between the optical axis 102 and an exit pupil 106 of the image sensing optical system 101.

Figure 3:
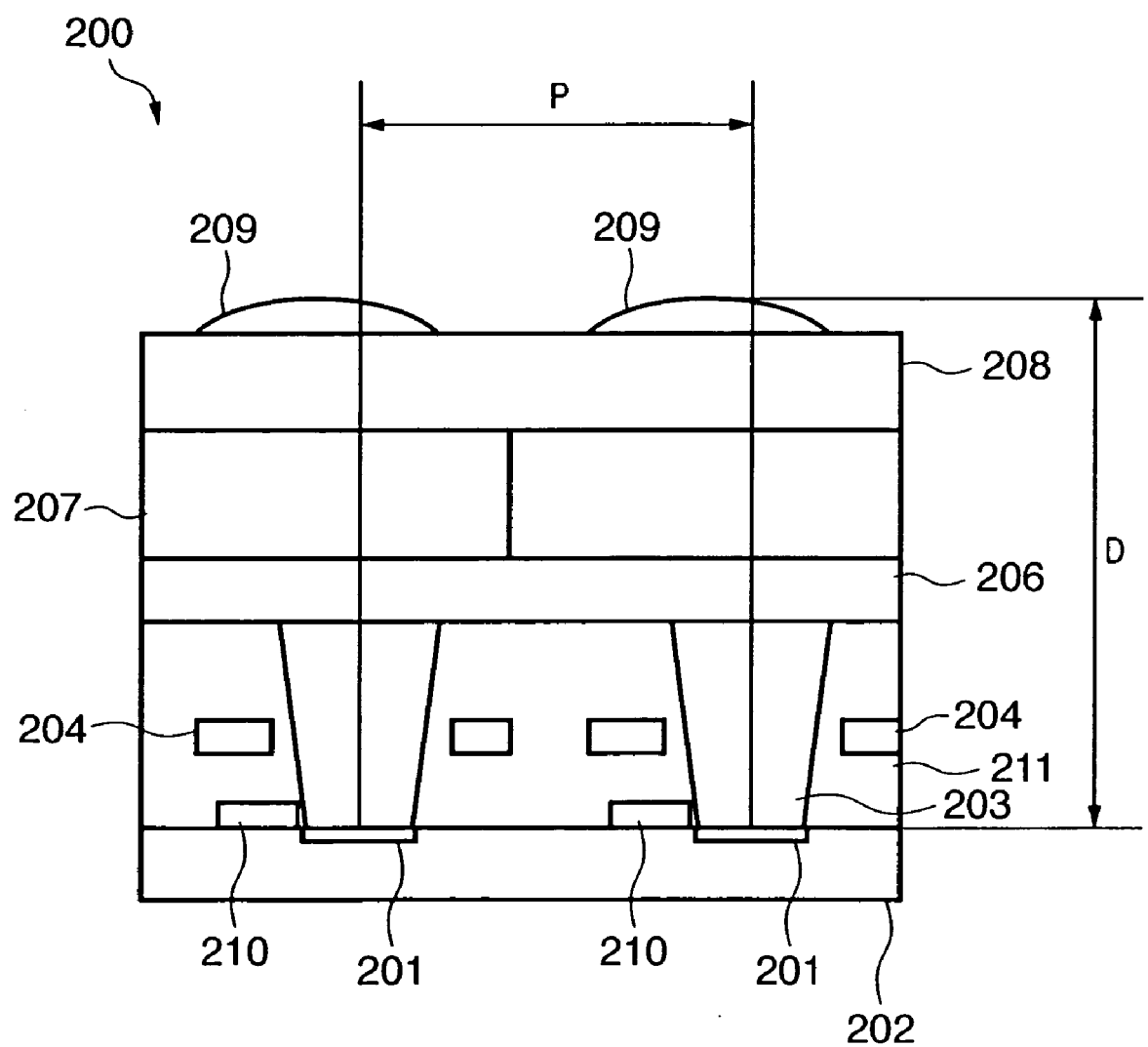
FIG. 3 is a sectional view showing the structure of a CMOS type solid-state image sensing element.

FIG. 3 is a sectional view showing an example of an image sensor equipped in an image sensing device such as a digital still camera system or the like, i.e., solid-state image sensing elements 200 for two pixels of a CMOS type image sensor having a light guide in a portion A of the image sensor 103 shown in FIG. 2.

Referring to FIG. 3, reference numeral 201 denotes a photoelectric conversion unit; 202, a silicon (Si) substrate on which the photoelectric conversion unit 201 is formed; and 203, a light guide formed of SiN or the like as a material having a high refractive index. The central axis of the light guide 203 substantially agrees with that of the photoelectric conversion unit 201. The light entrance side of the light guide 203 is formed to have a broader opening so as to receive more light components. Reference numeral 210 denotes a transfer electrode which is formed in an insulating interlayer 211 formed of $SiO_2$ or the like with a low refractive index, and is used to transfer a photo charge generated by the photoelectric conversion unit 201 to a floating diffusion (FD) unit (not shown); and 204, wiring electrodes having a light-shielding function of preventing light from entering portions other than the photoelectric conversion unit 201. Reference numeral 206 denotes a flattening layer which is formed on a uneven surface due to electrodes and wiring layers (not shown) to provide a flat surface. A color filter 207 is formed on the flattening layer 206, and a microlens 209 is also formed on the flattening layer 206. The shape and layout position of the microlens 209 are determined to focus an object light beam coming from the image sensing optical system 101 shown in FIG. 2 onto the photoelectric conversion unit 201.

Light transmitted through the microlens 209 is transmitted through the flattening layer 208, and undergoes wavelength selection in the color filter layer 207. For example, when the color filter layer 207 of the left pixel in FIG. 3 transmits a green light component, blue and red light components are absorbed. When the color filter layer 207 of the right pixel in FIG. 3 transmits a blue light component, green and red light components are absorbed. Light of a predetermined wavelength, which has been transmitted through the color filter layer 207 is transmitted through the light guide 203 formed of a transparent material with a high refractive index (refractive index $N_H$) such as silicon nitride (SiN) or the like, and is guided to the photoelectric conversion unit 201. Since the insulating interlayer 211 is formed around the light guide 203 using a transparent material with a low refractive index (refractive index $N_L$) such as silicon oxide ($SiO_2$) or the like, light that goes from the light guide 203 to the insulating interlayer 211 is totally reflected by a boundary surface between the light guide 203 and insulating interlayer 211, and is guided to the photoelectric conversion unit 201. The refractive index $N_L$ of the insulating interlayer 211 formed of silicon oxide ($SiO_2$) is, e.g., 1.46.

Let P be the spacing (pixel pitch) between neighboring pixels, and D be the height from the apex of the microlens 209 to the photo-receiving surface of the photoelectric conversion unit 201.

Figure 5:
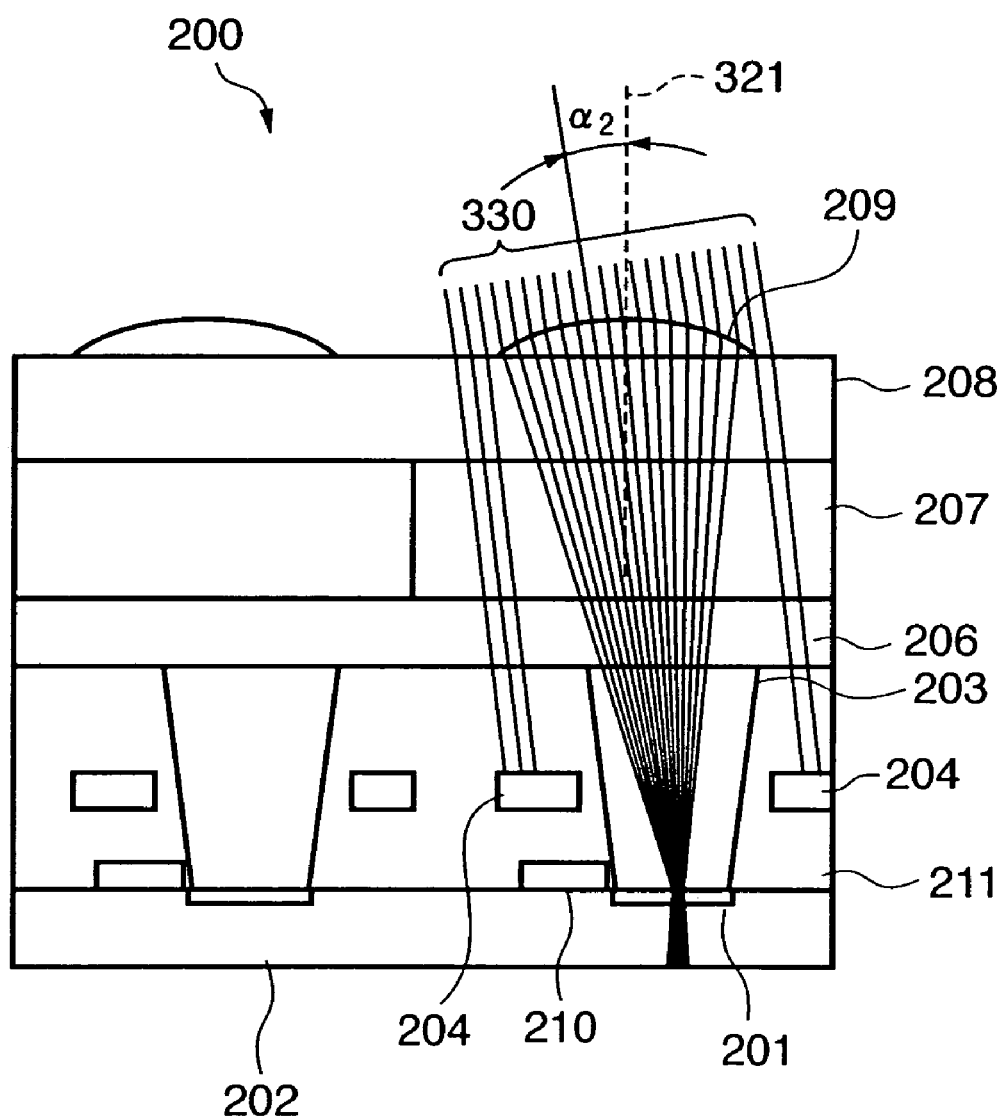
FIG. 5 is a ray-tracing diagram of the solid-state image sensing element shown in FIG. 3.

FIG. 4 is a ray-tracing diagram in the pixel arrangement shown in FIG. 3 when the image sensing optical system 101 is "close" to the image sensor 103, i.e., the pupil distance L is short, and FIG. 5 is a ray-tracing diagram in the pixel arrangement shown in FIG. 3 when the image sensing optical system 101 is "far" from the image sensor 103, i.e., the pupil distance L is long.

In case of the solid-state image sensing element 200 with the light guide 203, as shown in FIG. 4, even when the indent angle $\theta=\alpha1$ of an object light beam 330 with respect to an optical axis 321 is large (when the pupil distance L is short), the light is totally reflected by a slope of the light guide 203, and is efficiently guided to the photoelectric conversion unit 201.

When the pupil distance L of the image sensing optical system 101 is long and the indent angle $\theta=\alpha2$ of the object light beam 330 with respect to the optical axis 321 is small, as shown in FIG. 5, the object light 330 directly enters the photoelectric conversion unit 201 without being reflected by the slope of the light guide 203.

FIG. 6 is a graph showing the photo-receiving efficiency of the solid-state image sensing element 200 with the structure shown in FIG. 3 with respect to the incident angle of the object light beam. Note that the dotted curve in FIG. 6 shows the photo-receiving efficiency of a solid-state image sensing element without any light guide 203 for reference. The graph shown in FIG. 6 shows the ratio of the photo-receiving amount of the photoelectric conversion unit 201 with respect to the incident angle θ of the object light beam 330, so as to have "1" as a case wherein the amount of the object light beam 330 received by the photoelectric conversion unit 201 via the microlens 209 becomes maximum when the angle (incident angle) θ the object light beam makes with the central axis 321 of the microlens 209 (or the central axis of the photoelectric conversion unit 201) is changed. In FIG. 6, the ordinate plots the ratio of the photo-receiving amount, and the abscissa plots the incident angle θ. Also, in FIG. 6, assume that the object light beam 330 is parallel light, and a pixel is located at the outermost periphery of the image sensor 103.

For example, if the incident angle range when the ratio of the photo-receiving amount is "0.8" or more is determined as an effective range (a range in which an object image can be reproduced with high definition) of the solid-state image sensing element, when no light guide 203 is formed, allowance of an incident angle of the object light beam ranges for about 17. On the other hand, when the light guide 203 is formed, allowance of an incident angle of the object light beam ranges for about 24°.

The incident angle range of the object light beam within which a predetermined photo-receiving ratio can be obtained is called "incident angle redundancy". In the example shown in FIG. 6, an incident angle redundancy $\theta_2$ when the light guide 203 is formed is about 24, and an incident angle redundancy $\theta_1$ when no light guide 203 is formed is about 17°. Hence, we can say that "the incident angle redundancy is improved by about 7°" when the light guide 203 is formed compared to the case wherein no light guide 203 is formed.

When the image sensing optical system 101 performs zooming, the angle of the chief ray (an oblique ray that has passed the center of the pupil 106 of the image sensing optical system 101 of the object light beam) of the object light beam that enters the solid-state image sensing element 200 changes in accordance with the pupil position of the image sensing optical system 101 that changes according to the focal length (see θ in FIG. 2). Hence, the "incident angle redundancy" can be rephrased as an allowable range of the angle of the chief ray or an allowable range of the pupil position. The allowable range of the pupil position will be referred to as a "redundancy of the pupil position" or "pupil redundancy".

The relationship between the solid-state image sensing element 200 and pupil redundancy in the first embodiment will be described below.

As shown in FIG. 2, since the angle the chief ray 107 makes with the optical axis 102 is θ, we have:

$$\tan\theta = \frac{H}{L} \quad (1)$$

Based on this, the relationship among the image height H, pupil distance L, pixel pitch P, height D, refractive index $N_H$ of the light guide 203, and refractive index $N_L$ of the insulating interlayer 211 is given by:

$$\frac{H \cdot D}{L \cdot P} < a \cdot \frac{N_H}{N_L} \quad (2)$$

When the image height H, pupil distance L, pixel pitch P, height D, refractive index $N_H$ of the light guide, and refractive index $N_L$ of the insulating interlayer are selected to make the coefficient a meet:

$$0 < a < 1 \quad (3)$$

the effect for the photo-receiving efficiency of the light guides structure can be improved.

Inequality (2) will be described in detail below.

FIGS. 7A and 7B are views for explaining the relationship between the refractive index of the light guide 203 and the critical angle that causes total reflection by the slope of the light guide 203, and simply illustrate only portions associated with a description of the structure of the solid-state image sensing element 200 shown in FIG. 3.

The refractive index $N_H$ of the light guide 203 is $n_1$ in FIG. 7A, and it is $n_2$ in FIG. 7B ($n_1 < n_2$). As shown in FIGS. 7A and 7B, if the refractive index $N_H$ of the light guide 203 becomes large ($n_1 < n_2$), a critical angle β that causes total reflection by the slope of the light guide 203 becomes small ($β_1 < β_2$). Hence, the opening on the light entrance side of the light guide 203 can be broadened.

Figure 8A:
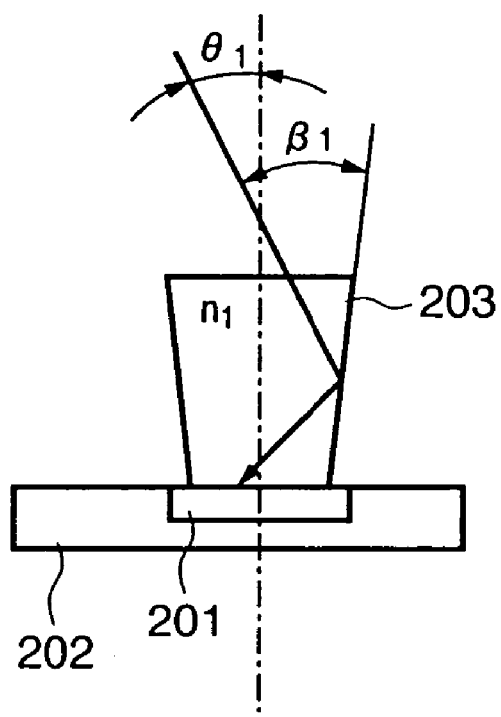
FIGS. 8A and 8B are views for explaining the relationship between the refractive index and critical angle of a light guide.
Figure 8B:
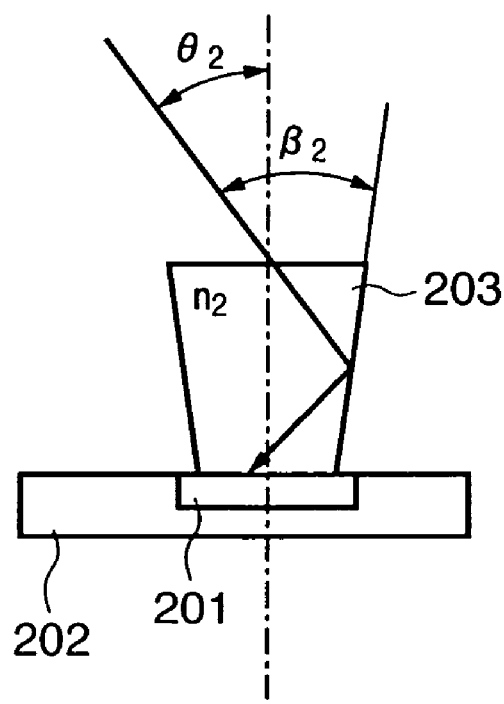

As shown in FIGS. 8A and 8B, if the shape of the light guide 203 remains the same, the critical angle β becomes larger ($β_1 < β_2$) when the refractive index $N_H$ is large ($n_1 < n_2$), as described above. Hence, with a larger reference index $N_H$, the object light beam 330 with a larger incident angle θ when the pupil distance L is short and the angle θ the optical axis 102 makes with the chief ray 107 in FIG. 2 is larger can be totally reflected by the slope of the light guide 203, and can be efficiently guided to the photoelectric conversion unit 201 ($θ_1 < θ_2$), thus improving the pupil redundancy.

Furthermore, the same applies to a case wherein the refractive index $N_L$ of the insulating interlayer 211 is decreased. That is, since the critical angle β that causes total reflection by the slope of the light guide 203 becomes small in this case, the pupil redundancy can be improved as in the case of large $N_H$. Also, the opening can be broadened.

That is, as can be seen from FIG. 2, when the image height H is constant and the pupil distance L becomes short, the angle θ the optical axis 102 makes with the chief ray 107 increases with decreasing pupil distance L. Hence, by increasing the refractive index $N_H$ of the light guide 203 or decreasing the refractive index $N_L$ of the insulating interlayer 211 accordingly, the pupil redundancy can be improved. Also, the opening can be broadened.

The same applies to a case wherein the pupil distance L is constant and the image height H increases. As can be seen from FIG. 2, since the angle θ the optical axis 102 makes with the chief ray 107 increases with increasing image height H, the pupil redundancy can be improved by increasing the refractive index $N_H$ of the light guide 203 or decreasing the refractive index $N_L$ of the insulating interlayer 211 accordingly. Also, the opening can be broadened.

Moreover, even when the image height H and pupil distance L are constant, if the height D of the solid-state image sensing element 200 shown in FIG. 3 increases, the incident angle of the object light beam 330 becomes deeper. In such case as well, by increasing the refractive index $N_H$ of the light guide 203 or decreasing the refractive index $N_L$ of the insulating interlayer 211 according to an increase in height D of the solid-state image sensing element 200, the pupil redundancy can be improved. Also, the opening can be broadened.

In addition, when the image height H and pupil distance L are constant, if the pixel pitch P of the solid-state image sensing element 200 is narrowed down, the size of the photoelectric conversion unit 201 decreases (i.e., a pixel size is reduced) because of wiring layers and the like, and the object light beam 330 that enters the photoelectric conversion unit 201 decreases. In order to increase the amount of the object light beam 330 that enters the photoelectric conversion unit 201 without changing the size of the photoelectric conversion unit 201, the refractive index $N_H$ of the light guide 203 is increased or the refractive index $N_L$ of the insulating interlayer 211 is decreased with decreasing pixel pitch P of the solid-state image sensing element 200. As a result, a broader incident angle redundancy can be assured. Hence, even when the slope of the side surface of the light guide 203 is increased to broaden the opening, as shown in FIG. 7B, the object light beam 330 that enters the photoelectric conversion unit 201 can be increased.

The coefficient a in the right-hand side of inequality (2) will be described below.

Figure 9:
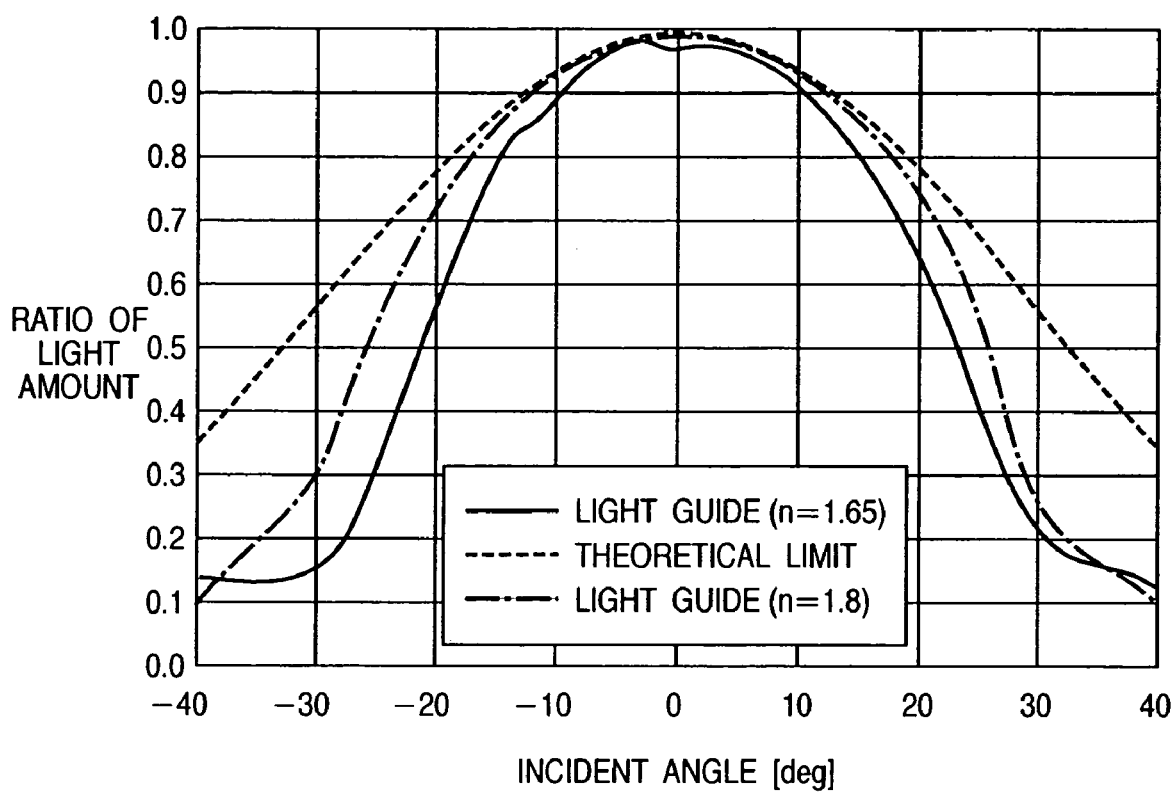
FIG. 9 is a graph showing the photo-receiving efficiency with respect to the incident angle of an object light beam onto the solid-state image sensing element according to the first embodiment of the present invention.

FIG. 9 is a graph showing the photo-receiving efficiency of the solid-state image sensing element 200 with respect to the incident angle of the object light beam in one pixel located at the center of the solid-state image sensing element 200. As in FIG. 6, FIG. 9 shows the ratio of the photo-receiving amount of the photoelectric conversion unit 201 with respect to the incident angle θ of the object light beam 330, so as to have "1" as a case wherein the amount of the object light beam 330 received by the photoelectric conversion unit 201 via the microlens 209 becomes maximum when the angle (incident angle) θ the object light beam makes with the central axis 321 of the microlens 209 (or the central axis of the photoelectric conversion unit 201) is changed. Also, assume that the object light beam 330 is parallel light.

The theoretical limit shown in FIG. 9 indicates the cosine-$4^{th}$-power law. The cosine-$4^{th}$-power law will be briefly described below by applying it to the solid-state image sensing element 200. If the amount of the object light beam 330 is constant, the amount of light received by the photoelectric conversion unit 201 is proportional to the 4th power of cosine of the angle θ the chief ray 107 makes with the optical axis 102. Hence, the amount of light that enters the photoelectric conversion unit 201 decreases in accordance with the incident angle of the object light beam 330.

Note that theoretically the cosine-$4^{th}$-power law can be applied to only the central pixel of the solid-state image sensing element 200. However, a peripheral pixel exhibits the same tendency as the central pixel although its peak position deviates.

Also, FIG. 9 shows simulation results when the refractive index $N_H$ of the light guide 203 is 1.65 and 1.80. At this time, the values such as the height D of the solid-state image sensing element 200 are as follows:

image height H=4251 [μm]
pupil distance L=15000 [μm]
pixel pitch P=3.25 [μm]
height D=6.0 [μm]
refractive index $N_L$ of insulating interlayer 211=1.46

When the aforementioned values are substituted in inequality (2) and the position of the radio="0.8" of the light amount of the solid-state image sensing element 200 is defined as the effective range (as the definition range of the pupil redundancy), the calculated coefficient a is:

$$a = 0.717 \quad (4)$$

This a satisfies inequality (3).

Figure 30:
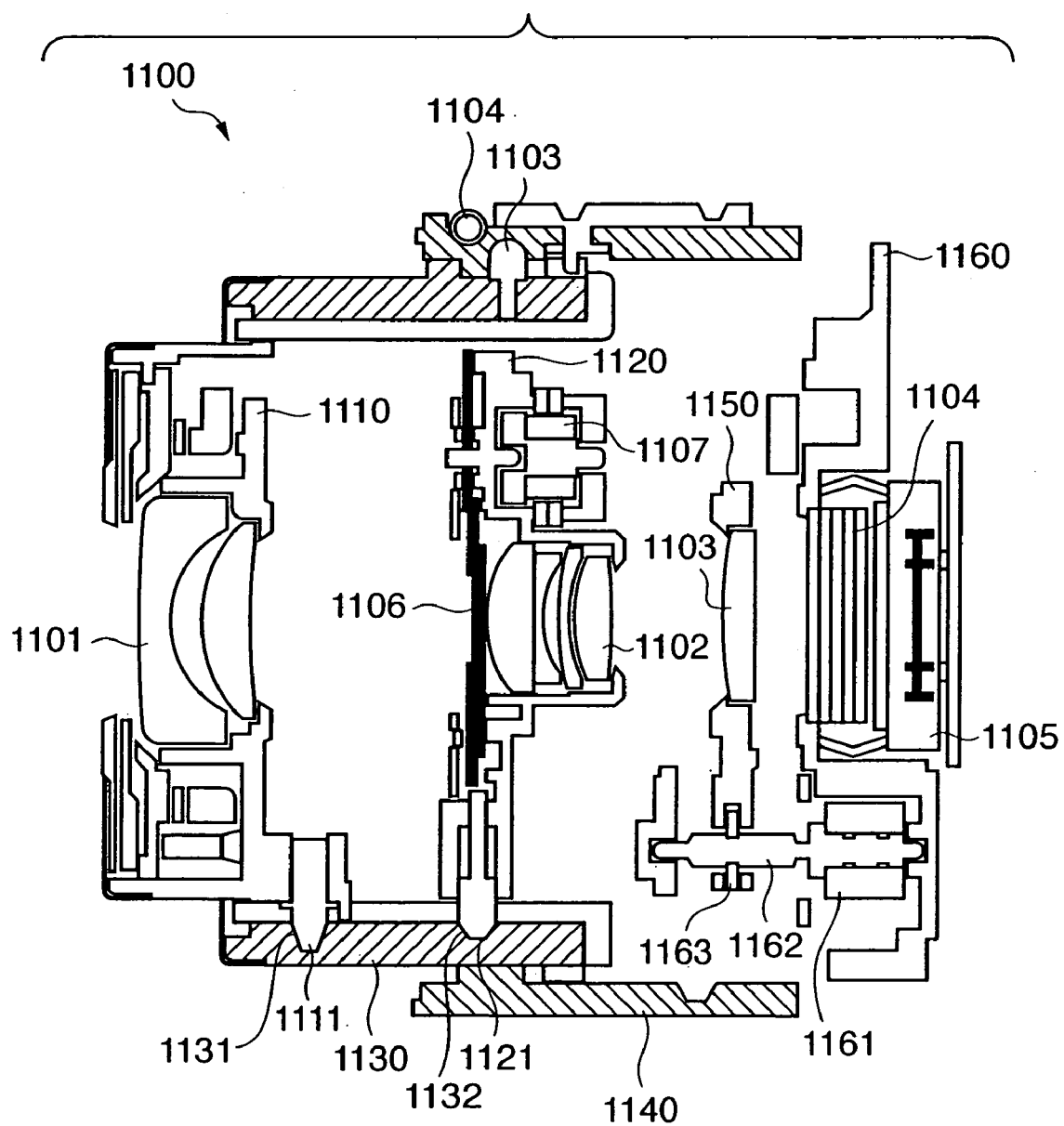
FIG. 30 is a schematic sectional view showing an image sensing system of a conventional compact digital camera.

In case of the conventional compact digital camera shown in FIG. 30, the image height H=3320 μm and the incident angle θ of the chief ray 107 falls within the range from 3 to 9, as described above. At this time, assume that the pupil distance L ranges from 21 mm to 60 mm.

For example, assuming the solid-state image sensing element 200 which satisfies the pupil distance L=7 mm to 20 mm as ⅓ of the conventional values, the relationship between the pixel pitch P of the solid-state image sensing element 200 and the refractive index $N_H$ of the light guide 203 is calculated based on inequality (2) and equation (4) by:

$$N_H \times P > 5.795 \; [\mu m]$$

Since the resolution improves with decreasing pixel pitch P of the solid-state image sensing element 200, if the pixel pitch P is 3.25 μm, we have:

$$N_H > 1.78 \quad (5)$$

Hence, by forming the light guide 203 of the solid-state image sensing element 200 equipped in the compact digital camera using a material that satisfies inequality (5), light transmitted through the light guide 203 is totally reflected by the boundary surface between the light guide and the insulating interlayer 211, and is efficiently collected on the photoelectric conversion unit. As a result, a high-quality image can be obtained, and a high-resolution image can also be obtained since a solid-state image sensing element with a smaller pixel size can be adopted. Furthermore, since the pupil distance L can be shortened, light can be efficiently collected on the photoelectric conversion unit 201 in case of a tele-photo type image sensing optical system 101 which cannot be adopted in the conventional compact digital camera. Hence, not only the degree of freedom in design of the image sensing system improves, but also a size reduction of the image sensing system can be achieved. In the above example, the refractive index $N_H$ of the light guide 203 is calculated. However, the present invention is not limited to this, and any of conditions in inequality (2) may be open. In this manner, an unsettled condition can be simulated based on values settled as design conditions.

As described above, a program that computes inequality (2) is input in advance to an information processing apparatus such as a personal computer or the like, computes using input parameters that indicate required conditions, and displays the determination result and computation result of equation (4) and inequality (5). Thus, the designer can easily know if the solid-state image sensing element that meets the input conditions has a sufficient critical angle, or which condition is to be satisfied to realize a solid-state image sensing element that meets the conditions (dimensions, material, and the like), thus allowing easy design of the solid-state image sensing element.

Figure 10:
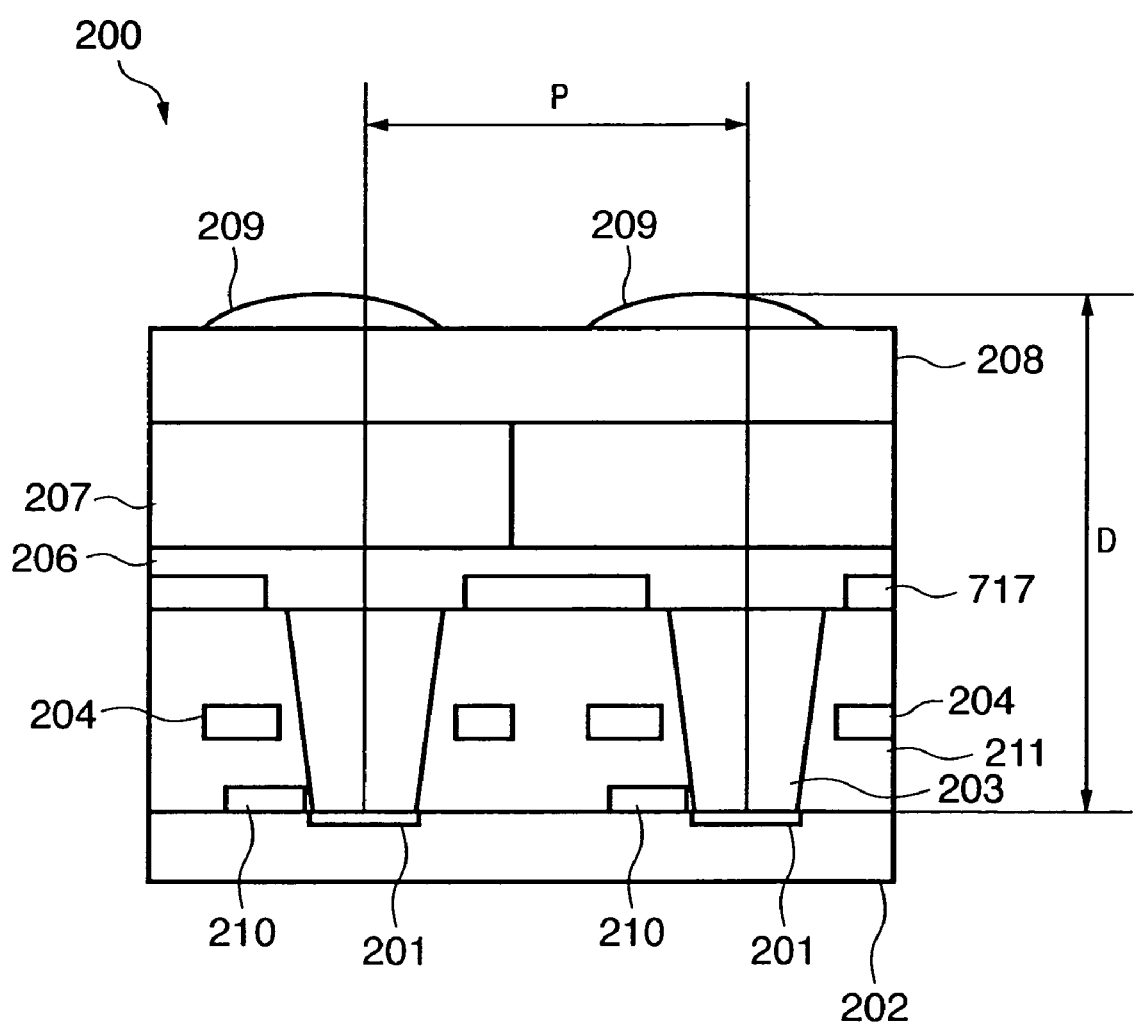
FIG. 10 is a sectional view showing another structure of a CMOS type solid-state image sensing element.

The structure of the solid-state image sensing element that can be applied to the present invention is not limited to that shown in FIG. 3. FIG. 10 shows another example of the structure of a solid-state image sensing element which can be applied to the present invention.

The same reference numerals in FIG. 10 denote the same parts as in FIG. 3. FIG. 10 shows an example having a second wiring electrode 717 which has a light shielding function of preventing light from entering portions other than the photoelectric conversion unit 201, in addition to components shown in FIG. 3. The flattening layer 206 is formed on an uneven surface due to the second wiring electrode 717 and wiring layers (not shown) to provide a flat surface.

To summarize the aforementioned contents, in order to improve the light collecting effect even in case of an object light beam which has a large incident angle to the solid-state image sensing element 200, the structure of the light guide is determined based on the following properties.

1. If the image height H increases, the incident angle θ becomes larger.

2. If the pupil distance L increases, the incident angle θ becomes smaller.

3. The critical angle that causes total reflection at the boundary surface between the light guide and the insulating interlayer decreases with decreasing $N_L/N_H$, i.e., the ratio of the refractive index $N_L$ of the insulating interlayer to the refractive index $N_H$ of the light guide, and light rays incident at a larger incident angle θ can be captured.

4. If the pixel pitch P decreases, an area occupied by a circuit portion of each pixel increases, the photoelectric conversion unit size decreases relatively, and light rays incident at a larger incident angle θ cannot be captured. In case of the CMOS type solid-state image sensing element, the circuit portion includes a charge transfer MOS transistor, a reset MOS transfer for supplying a reset potential, a source-follower MOS sensor transistor, a selection MOS transistor for selectively outputting a signal from the source-follower MOS sensor transistor, and the like.

5. If the height D from the photoelectric conversion unit to the microlens increases, an angle at which the photoelectric conversion unit can be seen from the microlens decreases, and light rays with a larger incident angle θ cannot be captured.

As can be seen from these properties, an evaluation value E, which is based on inequality (2) expressed by the image height H, pupil distance L, pixel pitch P, height D, refractive index $N_H$ of the light guide, and refractive index $N_L$ of the insulating interlayer, and is given by:

$$E = \frac{H \cdot D \cdot N_L}{L \cdot P \cdot N_H} \quad (6)$$

can be an index suited to express the amount of light rays with large incident angle θ that can be guided to the photoelectric conversion unit. Note that the effect of the light guide structure is large when the image height H, pupil distance L, pixel pitch P, height D, refractive index $N_H$ of the light guide, and refractive index $N_L$ of the insulating interlayer are selected to meet:

$$E < 1.0 \quad (7)$$

It is ideal that the lens-exchangeable digital camera system uses a solid-state image sensing element having a light guide that can efficiently focus object light independently of an exchangeable lens mounted on the camera body. The light guide is formed based on inequality (2) using lens information of an exchangeable lens that can be mounted on the camera.

Figure 11:
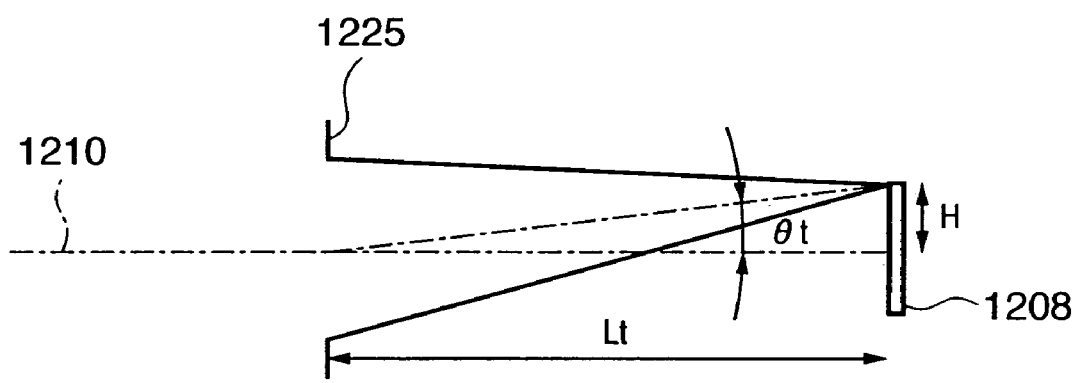
FIG. 11 is an explanatory view of an incoming light beam when a tele-photo lens is mounted on a lens-exchangeable digital camera system.
Figure 31:
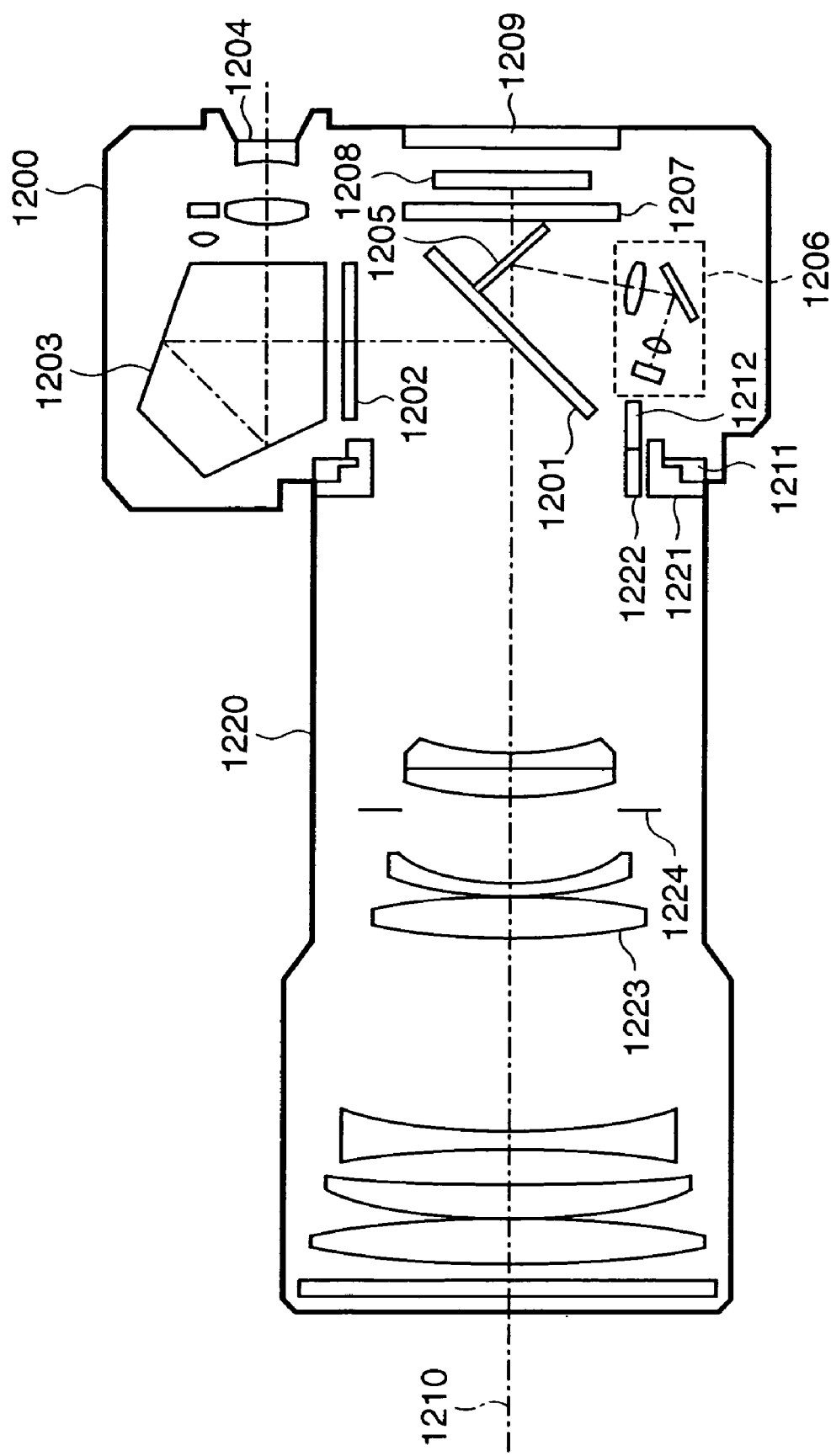
FIG. 31 is a schematic sectional view of a conventional digital still camera when a tele-photo lens is mounted on a lens-exchangeable digital camera system.
Figure 32:
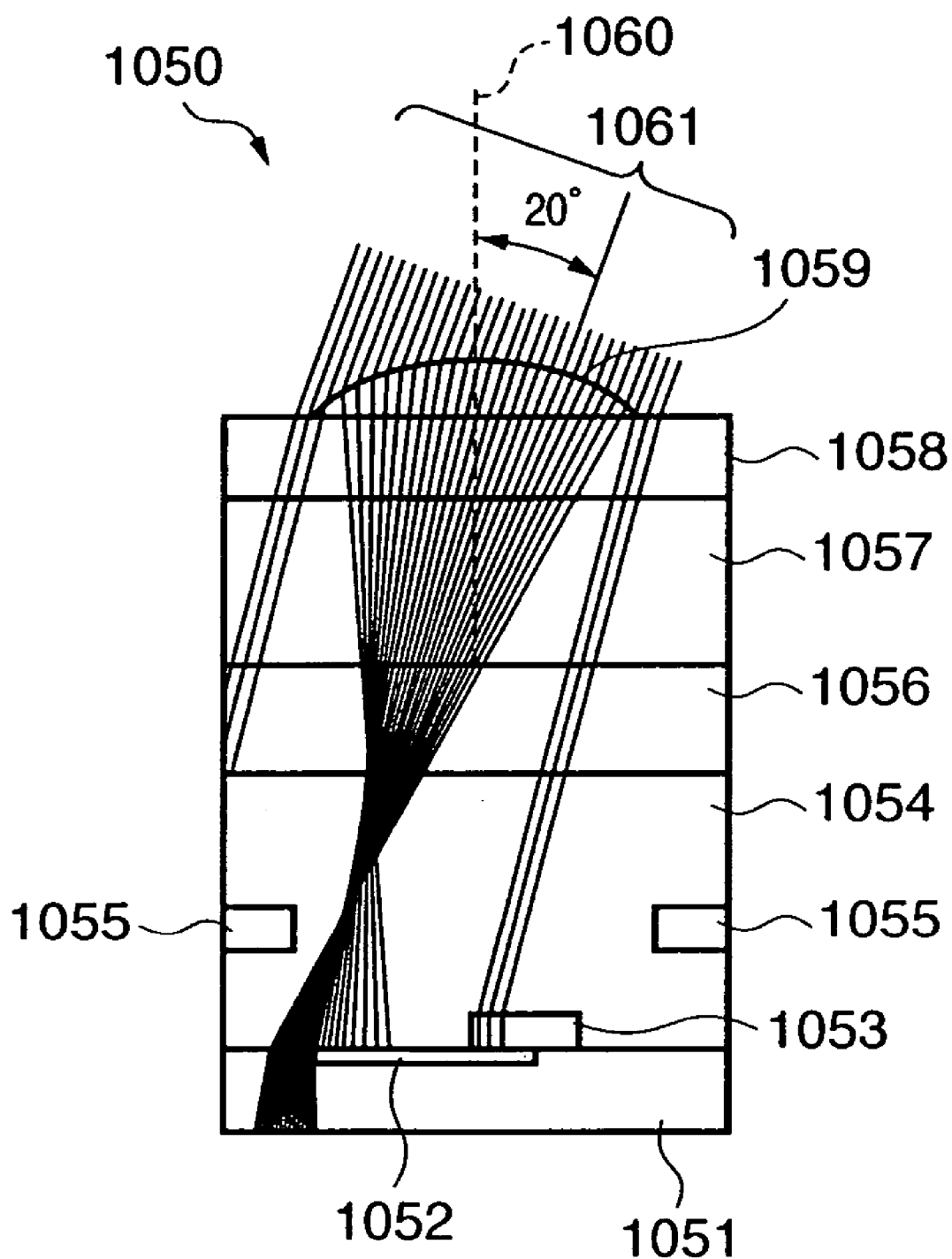
FIG. 32 is a ray-tracing diagram for explaining a limitation on the image sensing system of the conventional compact digital camera.

FIG. 11 is an explanatory view of an incoming light beam to an image sensor 1208 when the image sensor using the solid-state image sensing elements with the above structure is applied to a lens-exchangeable digital camera system shown in FIG. 31. As described above, in FIG. 31, a tele-photo lens 1220 is mounted as an exchangeable lens.

In the lens-exchangeable digital camera system shown in FIG. 31, the frame size of the image sensor 1208 to be mounted is substantially equal to the APS-C size (about 17×25 mm) as the film size of a silver halide camera. Hence, the image height H of pixels located at corners of the frame is about 15 mm.

Also, the height D from the apex of the microlens to the photoelectric conversion unit of the solid-state image sensing element used in the image sensor 1208 is about 0.006 mm.

The insulating interlayer filled around the light guide formed in the image sensor 1208 normally uses silicon oxide ($SiO_2$), and its refractive index $N_L$ is 1.46. Also, the light guide is normally formed of silicon nitride (SiN), and its refractive index $N_H$ is 2.0. Note that silicon oxide and silicon nitride are merely an example, and the present invention is not limited to these specific materials.

FIG. 11 indicates the position of an exit pupil 1225 of the tele-photo lens 1220. The exit pupil 1225 is formed at the position of a distance $L_t$ farther from the image sensor 1208. An object light beam that has been transmitted through the exit pupil 1225 enters the sensor 1208 at the position of the image height H. At this time, an incident angle $\theta_t$ of a chief ray to the image sensor 1208 satisfies:

$\tan \theta_t = H/L_t$

Figure 12:
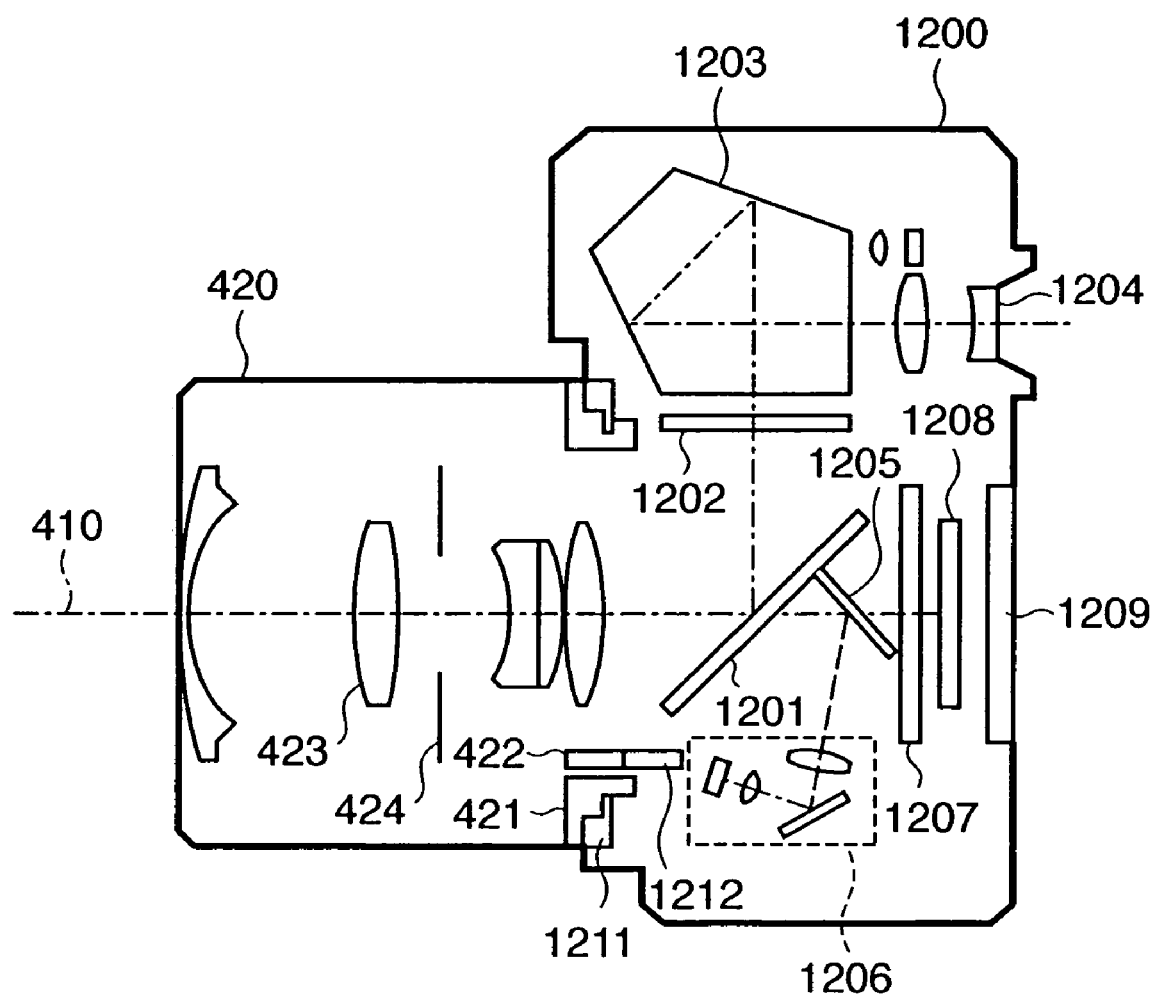
FIG. 12 is a schematic sectional view of a digital still camera when a wide-angle lens is mounted on a lens-exchangeable digital camera system.

FIG. 12 is a schematic view when the image sensor including the solid-state image sensing elements with the above structure is applied to a lens-exchangeable camera system on which a wide-angle lens 420 is mounted. Since the structure of the camera body is the same as that shown in FIG. 31, the same reference numerals denote its components, and a description thereof will be omitted.

A camera body 1200 and wide-angle lens 420 are coupled via a camera-side mount 1211 and lens-side mount 421. An electrical circuit such as a lens MPU, lens memory, and the like (not shown) provided to the wide-angle lens 420 is coupled to an electrical circuit such as a camera MPU and the like (not shown) via a lens-side contact 422 and camera-side contact 1212. The lens memory stores lens information such as the exit pupil position of the exchangeable lens and the like.

Figure 13:
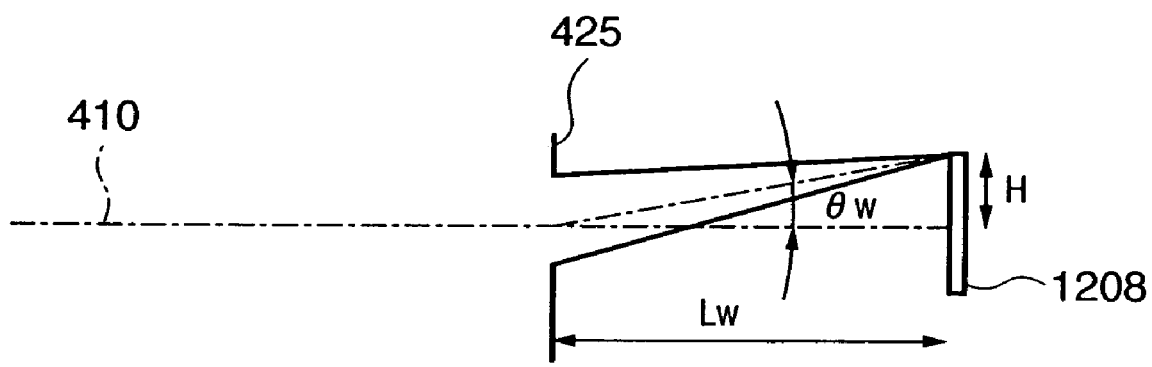
FIG. 13 is an explanatory view of an incoming light beam in the digital camera system shown in FIG. 12.

FIG. 13 is an explanatory view of an incoming light beam to the image sensor 1208 arranged in the digital camera system on which the wide-angle lens 420 shown in FIG. 12 is mounted. In FIG. 13, an exit pupil 425 of the retrofocus type wide-angle lens 420 is formed at the position of a distance $L_w$ closer to the image sensor 1208 than when the tele-photo lens 1220 is mounted (FIG. 11). An object light beam that has been transmitted through the exit pupil 425 of the wide-angle lens 420 enters the image sensor 1208 at the position of the image height H. At this time, an incident angle $\theta_w$ of a chief ray to the image sensor 1208 satisfies:

$\tan \theta_w = H/L_w$

As can be seen from FIGS. 11 and 13, the chief ray angle $\theta_w$ when the wide-angle lens is mounted on the camera and the chief ray angle $\theta_t$ when the tele-photo lens is mounted meet:

$\theta_w > \theta_t$ and the incident angle $\theta$ of the chief ray to the image sensor 1208 is larger when the wide-angle lens is mounted. Therefore, by determining the structure of the light guide using the exit pupil distance of a lens having a shorter exit pupil distance from the image height of exchangeable lenses that can be mounted on the camera, a solid-state image sensing element with higher photo-receiving efficiency can be designed. If the exit pupil distance L of a lens having a shorter exit pupil distance from the image height of the exchangeable lenses that can be mounted on the camera is about 60 mm (other conditions are the same as those described above), the relationship between the pixel pitch P of the image sensor 1208 and the evaluation value E is calculated based on inequality (2) by:

$E \times P = 0.0011$ [mm]

Since the resolution improves with decreasing pixel pitch P of the image sensor 1208, if the pixel pitch P is set to be 0.003 mm, the evaluation value E is:

$E = 0.37$ which satisfies inequality (7).

In this way, when the light guide of the solid-state image sensing element 200 to be mounted on the lens-exchangeable digital camera system is formed to satisfy equation (6) and inequality (7) using exchangeable lens information, light transmitted through the light guide is totally reflected by the boundary surface between the light guide and the insulating interlayer and is efficiently collected on the photoelectric conversion unit. As a result, a high-quality image can be obtained, and a high-resolution image can also be obtained since a solid-state image sensing element with a smaller pixel size can be adopted.

In the first embodiment, the structure of the light guide formed in the solid-state image sensing element is determined based on the exit pupil information of an exchangeable lens that can be mounted on the camera. Also, it is effective to determine the structure of the light guide in consideration of an open F-value in addition to the exit pupil information of an exchangeable lens.

As described above, when the light guide of the solid-state image sensing element to be mounted on an optical device is formed using a material that satisfies inequalities (2) and (3) irrespective of the compact digital camera or lens-exchangeable digital still camera, light transmitted through the light guide is totally reflected by the boundary surface between the light guide and the insulating interlayer, and is efficiently collected on the photoelectric conversion unit. As a result, a high-quality image can be obtained, and a high-resolution image can also be obtained since a solid-state image sensing element with a smaller pixel size can be adopted.

In case of the compact digital camera, the degree of freedom in design of the image sensing system improves, and a size reduction of the image sensing system can be achieved.

<Second Embodiment>

Figure 14:
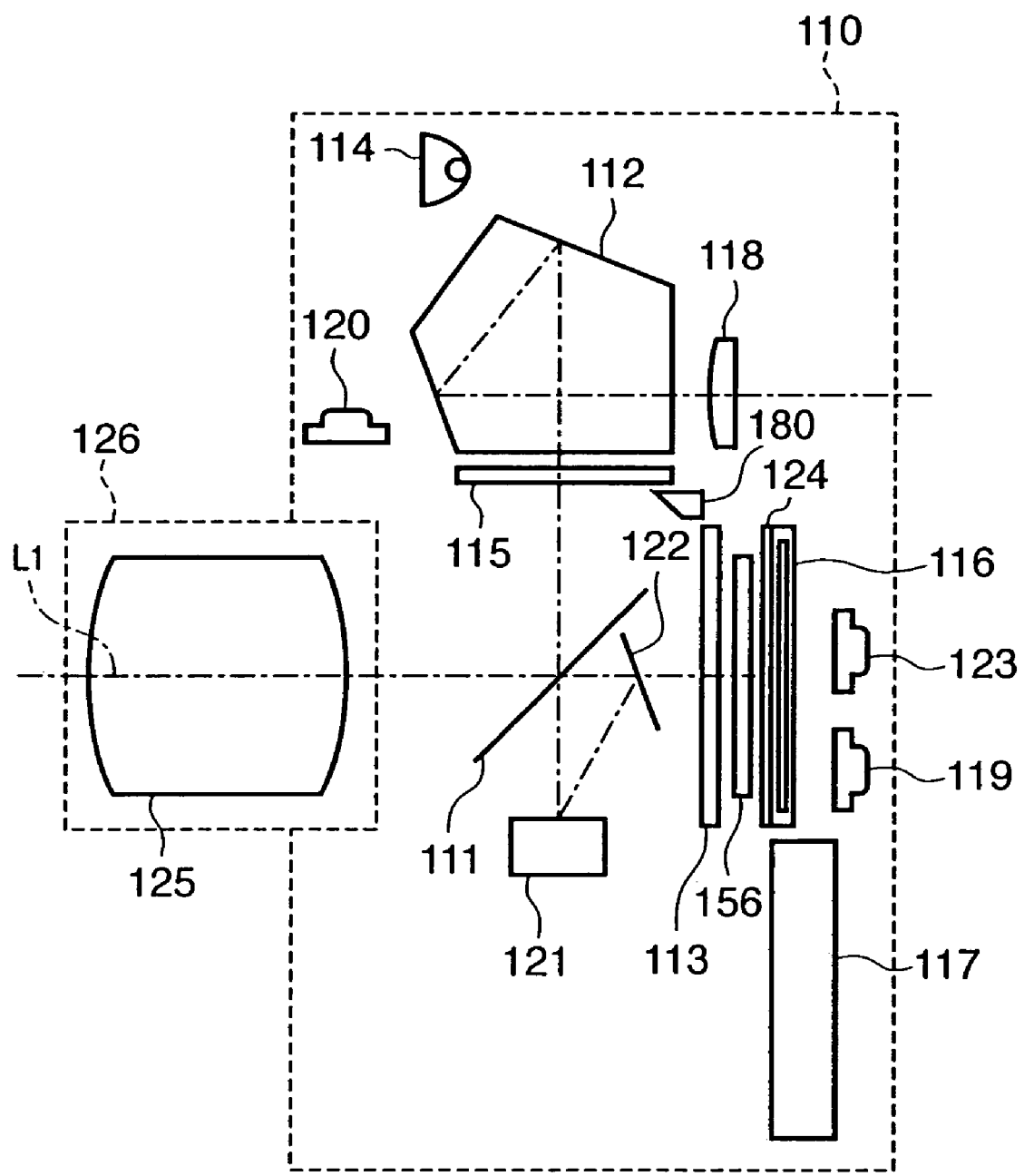
FIG. 14 is a side sectional view showing a schematic structure of a digital color camera according to the second embodiment of the present invention.

FIG. 14 is a side sectional view showing a schematic structure of a digital color camera as an image sensing device according to the second embodiment of the present invention. This camera is a single-plate type digital color camera using an image sensing element such as a CCD, CMOS sensor, or the like, and obtains an image signal indicating a moving or still image by driving the image sensing element continuously or in a one-shot manner. Note that the image sensing element is an area sensor which converts incoming light into charges according to the amount of light, accumulates the charges for respective pixels, and reads out the accumulated charges.

Referring to FIG. 14, reference numeral 110 denotes a camera body; and 126, a lens device which includes an image sensing lens 125 and is detachable from the camera body 110. Note that FIG. 14 depicts only one lens as the image sensing lens 125. However, the image sensing lens 125 is normally formed by combining a plurality of lenses. The lens device 126 is electrically and mechanically connected to the camera body 110 via a known mount mechanism. By exchanging lens devices having different focal lengths, images with various angle of view can be shot. The lens device 126 includes a drive mechanism (not shown), which moves a focusing lens as an element of the image sensing lens in the direction of an optical axis L1, or change a refracting power to change the boundary surface shape when the focusing lens is formed of a flexible transparent elastic member or liquid lens, thereby attains focus adjustment to an object.

Reference numeral 116 denotes an image sensing element housed in a package 124. An optical low-pass filter 156 that controls the spatial frequency characteristics of the image sensing lens 125 is inserted in an optical path extending from the image sensing lens 125 to the image sensing element 116, so as not to transmit unnecessarily high spatial frequency components of an object image to the image sensing element 116. Also, an infrared cut filter (not shown) is formed on the image sensing lens 125.

An object image captured by the image sensing element 116 is displayed on a display device 117. The display device 117 is attached to the back surface of the camera, and the user can directly observe the displayed image. The display device 117 can be formed as a low-profile structure having low power consumption, when it comprises an organic EL spatial modulation element or liquid crystal spatial modulation element, a spatial modulation element that utilizes electrophoretic migration of fine particles, or the like. Hence, such display device is convenient for a portable device.

Assume that the image sensing element 116 is a CMOS process compatible sensor which is one of amplification type image sensing elements in this embodiment. As one feature of the CMOS image sensing element, since peripheral circuits such as an image sensing element drive circuit, A/D conversion circuit, and image processor can be formed in the same process as MOS transistors of an area sensor portion, the numbers of masks and processes can be greatly reduced compared to the CCD. Also, the CMOS image sensing element has a feature that allows random access to an arbitrary pixel, and can read out pixel outputs by decimating them for display, thus allowing real-time display at a high display rate. The image sensing element 116 performs a display image output operation and high-definition image output operation by utilizing these features. Note that the present invention is not limited to the CMOS sensor, and solid-state image sensing elements of other types such as a CCD and the like can be used.

Reference numeral 111 denotes a movable half mirror which splits the optical path from the image sensing lens 125 to an optical viewfinder; 115, a focusing screen arranged on a prospective image field of an object image; and 112, a pentaprism. Reference numeral 118 denotes a lens used to observe a viewfinder image. The lens 118 includes a plurality of lenses for the dioptric adjustment function in practice. The focusing screen 115, pentaprism 112, and lens 118 form a viewfinder optical system. The refractive index of the half mirror 111 is about 1.5, and its thickness is 0.5 mm. A movable sub mirror 122 is arranged behind the half mirror 111, and deflects, to a focus detection unit 121, a light beam closer to the optical axis of that which has been transmitted through the half mirror 111. The sub mirror 122 rotates about a rotation axis (not shown) and retracts from an image sensing optical path together with the half mirror 111 upon image sensing. The focus detection unit 121 attains focus detection based on, e.g., a phase difference detection method.

A small pyramidal periodic structure having a pitch smaller than the wavelength of visible light is formed using a resin on the surface of the half mirror 111 to serve as so-called photonic crystals, thereby reducing surface reflection of light due to the refractive index difference between air and the resin, and improving the light use efficiency. With this structure, any ghost produced by multiple reflection of light by the back and front surfaces of the half mirror can be suppressed.

A mirror drive mechanism which includes an electromagnetic motor and gear train (not shown) switches a state wherein it changes the positions of the half mirror 111 and sub mirror 122 to make a light beam from the image sensing lens 125 directly strike the image sensing element 116, and a state wherein the optical path is split to the optical viewfinder.

Reference numeral 114 denotes a movable flash emission device; 113, a focal plane shutter; 119, a main switch; 120, a release button; 123, a viewfinder mode switch for switching between the optical viewfinder and electronic viewfinder; and 180, an optical viewfinder information display unit.

Figure 15:
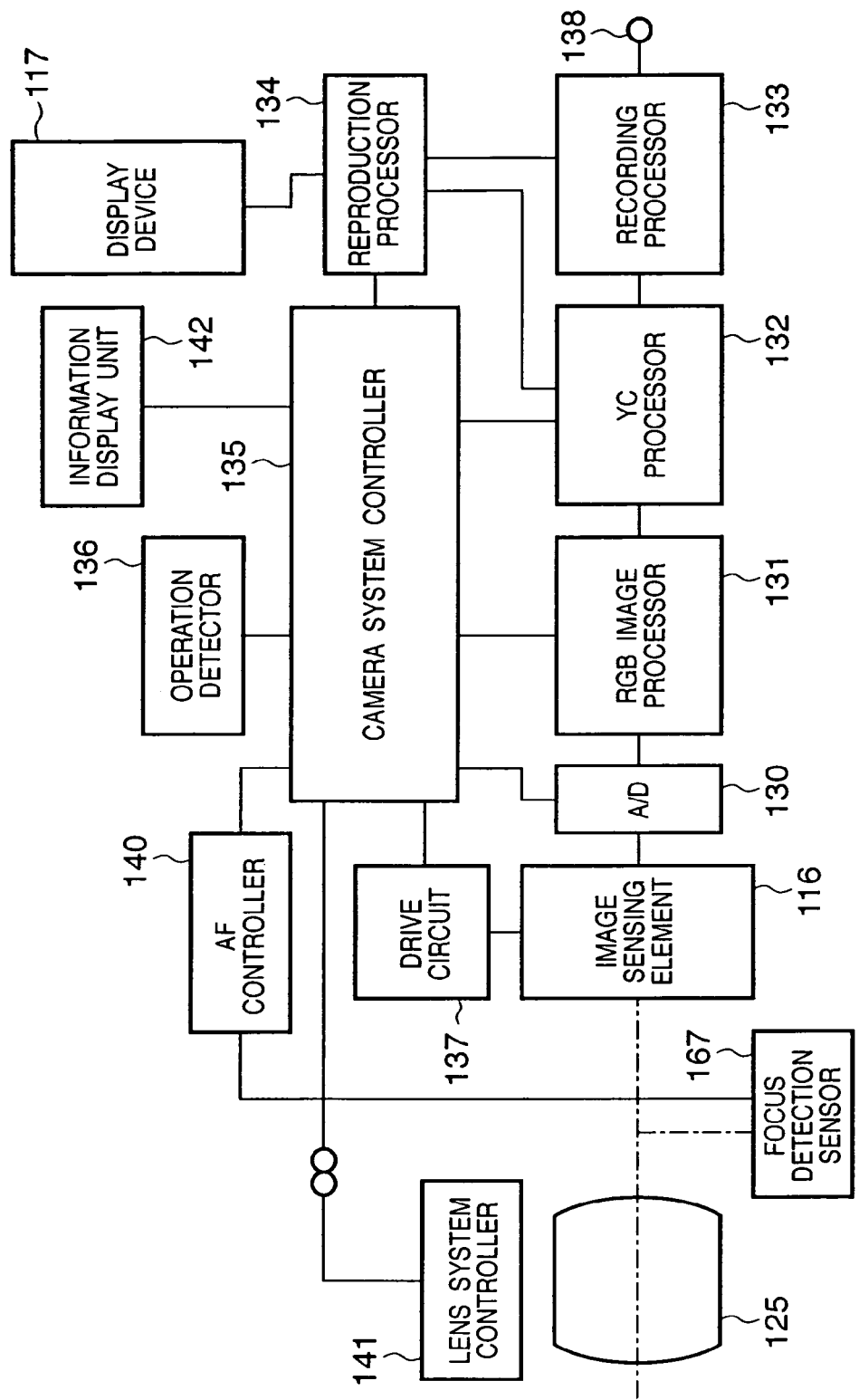
FIG. 15 is a block diagram showing the functional arrangement of the digital color camera shown in FIG. 14.

FIG. 15 is a block diagram showing the functional arrangement of the aforementioned digital color camera. Note that the same reference numerals in FIG. 15 denote the same parts as in FIG. 14.

The camera has an image sensing system, image processing system, recording/reproduction system, and control system. The image sensing system includes the image sensing lens 125 and image sensing element 116. The image processing system includes an A/D converter 130, RGB image processor 131, and YC processor 132. The recording/reproduction system includes a recording processor 133 and reproduction processor 134. The control system includes a camera system controller 135, an operation detector 136, and a drive circuit 137 for the image sensing element 116. Reference numeral 138 denotes a standardized connection terminal used to connect an external computer or the like so as to exchange data. These components are driven by a power supply means (not shown) such as a primary battery (alkaline battery, lithium battery, or the like), a secondary battery (NiCd battery, NiMH battery, Li battery, or the like), a compact fuel battery, an AC adapter, or the like.

The image sensing system is an optical processing system which images light coming from an object on the image sensing surface of the image sensing element 116 via the image sensing lens 125, and exposes the image sensing element 116 with an appropriate amount of object light by adjusting a stop (not shown) of the lens device 126 and also the focal plane shutter 113 as needed. The image sensing element 116 has a total of about 40 million square pixels (7400 in the longitudinal direction×5600 in the widthwise direction), and arranges one of R (red), G (green), and B color filters on every four pixels as one set in a so-called Bayer arrangement. In the Bayer arrangement, G pixels which are felt intensively when the observer observes an image are arranged more than R and B pixels, thus improving the total image quality. In general, an image process using the image sensing element of this type generates most of a luminance signal from a G signal, and generates color signals from R, G, and B signals. Note that the number of pixels and the color filter arrangement are not limited to the aforementioned ones, and can be changed as needed.

An image signal read out from the image sensing element 116 is supplied to the image processing system via the A/D converter 130. The A/D converter 130 is a signal processing circuit which converts into and outputs a 12-bit digital signal according to the amplitude of a signal of each exposed pixel. The image signal process after the A/D converter 130 is executed as a digital process.

The image processing system is a signal processing circuit which obtains an image signal of a desired format from the R, G, and B digital signals, and converts R, G, and B signals into YC signals including a luminance signal Y and color difference signals (R-Y) and (B-Y), or the like.

The RGB image processor 131 is a signal processing circuit for processing image signals of 7400×5600 pixels received from the image sensing element 116 via the A/D converter 130, and has a white balance circuit, gamma correction circuit, and interpolation circuit that attains high-resolution conversion by interpolation.

The YC processor 132 is a signal processing circuit for generating a luminance signal Y and color difference signals R-Y and B-Y. The YC processor 132 includes a high frequency luminance signal generation circuit for generating a high frequency luminance signal YH, a low frequency luminance signal generation circuit for generating a low frequency luminance signal YL, and a color difference signal generation circuit for generating the color difference signals R-Y and B-Y. The luminance signal Y is formed by mixing the high and low frequency luminance signals YH and YL.

The recording/reproduction system is a processing system which outputs an image signal to a memory (not shown) and outputs an image signal to the display device 117. The recording processor 133 performs read and write processes of an image signal on the memory, and the reproduction processor 134 reproduces an image signal read out from the memory, and outputs it to the display device 117.

The recording processor 133 includes a compression/expansion circuit which compresses YC signals that represents a still image or moving image in a predetermined compression format, and expands the compressed data when it is read out. The compression/expansion circuit includes a frame memory for a signal process, stores the YC signals from the image processing system for each frame in the frame memory reads out the YC signals for a plurality of blocks, and applies compression encoding to them. The compression encoding is done by applying two-dimensional orthogonal transformation, normalization, and Huffman encoding to image signals for respective blocks.

The reproduction processor 134 is a circuit for applying matrix conversion to the luminance signal Y and color difference signals R-Y and B-Y into, e.g., RGB signals. The signal converted by the reproduction processor 134 is output to the display device 117 to reproduce and display a visible image. The reproduction processor 134 and display device 117 may be connected via a wireless communication means such as Bluetooth or the like. With this arrangement, an image shot by this digital color camera can be monitored from a remote place.

The control system includes the operation detector 136 which detects operations of the release button 120, view-finder mode switch 123, and the like, the camera system controller 135 which controls respective units including the half mirror 111 and sub mirror 122 in response to the detection signal from the operation detector 136, and generates and outputs timing signals and the like upon image sensing, the drive circuit 137 for generating a drive signal for driving the image sensing element 116 under the control of the camera system controller 135, and an information display unit 142 for controlling the optical viewfinder information display device 180.

The control system controls the image sensing system, image processing system, and recording/reproduction system in response to external operations. For example, the control system controls the drive operation of the image sensing element 116, the operation of the RGB image processor 131, the compression process of the recording processor 133, and the like upon detection of depression of the release button 120. Furthermore, the control system controls the states of respective segments of the optical viewfinder information display device 180 that displays information in the optical viewfinder using the information display unit 142.

The camera system controller 135 checks the luminance level of an object on the basis of the luminance signal Y obtained from the YC processor 132. If it is determined that the object luminance level is low, and sufficient focus detection precision cannot be assured, the controller 135 instructs the flash emission device 114 or a white LED, fluorescent tube, or the like to illuminate an object with light. Conversely, if it is determined that the object luminance level is too high to cause highlight saturation, the controller 135 increases the shutter speed of the focal plane shutter 113 or shortens the charge accumulation period of the image sensing element 116 by an electronic shutter. In this way, the controller 135 adjusts an exposure amount.

An AF controller 140 and lens system controller 141 are further connected to the camera system controller 135. These controllers exchange data required for processes via the camera system controller 135.

The AF controller 140 obtains a signal output from a focus detection sensor 167 in a focus detection area set at a predetermined position on the image sensing frame, generates a focus detection signal on the basis of this signal output, and detects the fucusing state of the image sensing lens 125. Upon detection of defocus, the AF controller 140 converts this amount into the drive amount of the focusing lens as an element of the image sensing lens 125, and transmits it to the lens system controller 141 via the camera system controller 135. For a moving object, the AF controller 140 instructs the drive amount of the focusing lens on the basis of an estimation result of an appropriate lens position in consideration of a time lag from when the release button 120 is pressed until actual image sensing control starts.

Upon reception of the drive amount of the focusing lens, the lens system controller 141 performs, e.g., an operation for moving the focusing lens in the direction of the optical axis L1 using a drive mechanism (not shown) in the lens device 126, thus adjusting a focus on an object. When the AF controller 140 detects that a focus is adjusted onto the object, this information is supplied to the camera system controller 135. At this time, if the release button 120 is pressed, the image sensing control is implemented by the image sensing system, image processing system, and recording/reproduction system, as described above.

Figure 16:
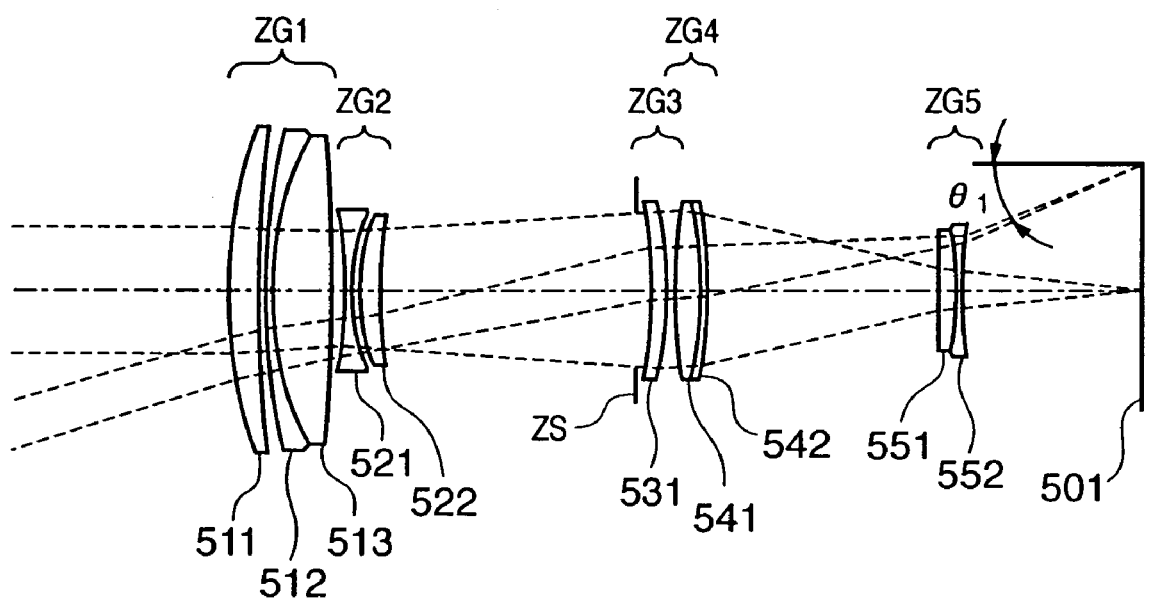
FIG. 16 is a view showing the lens arrangement of a zoom lens at the wide-angle end and ray-traces when a stop is open.
Figure 17:
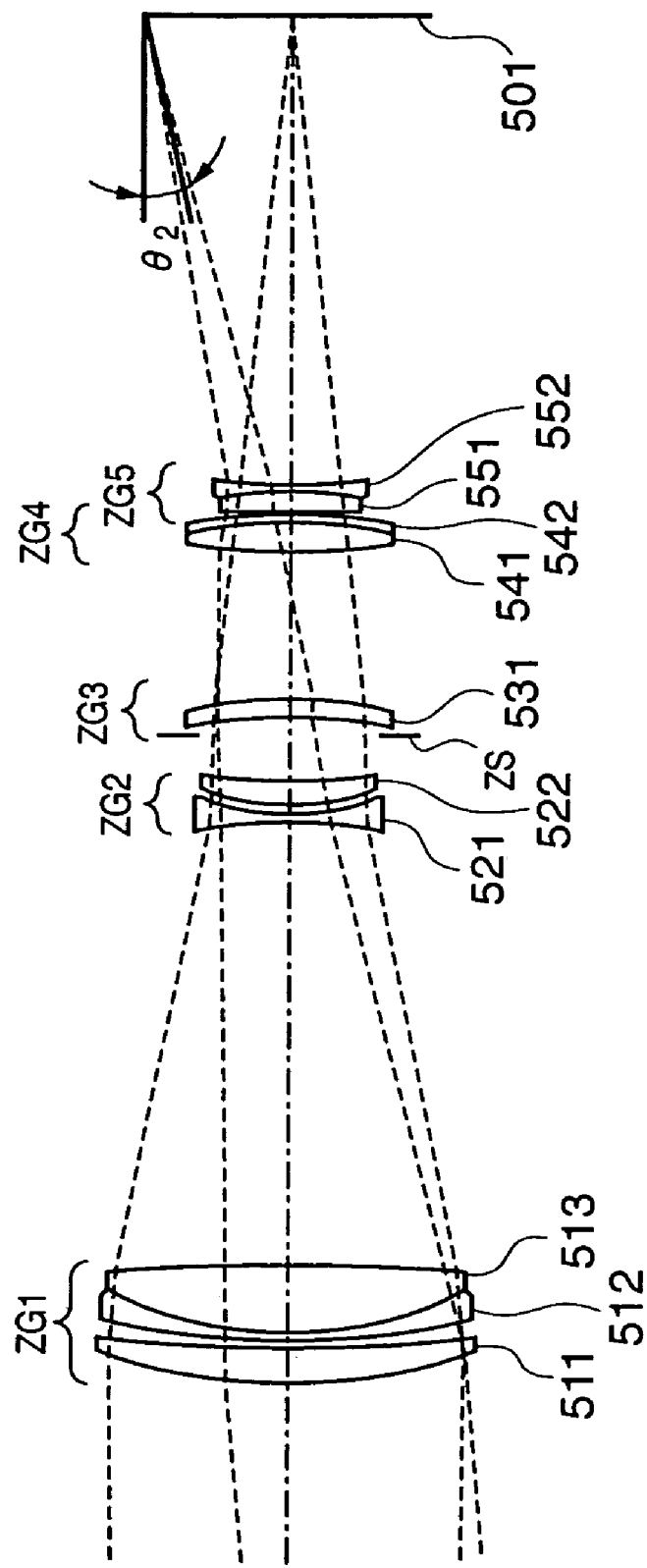
FIG. 17 is a view showing the lens arrangement of a zoom lens at the tele-photo end and ray-traces when a stop is open.

FIGS. 16 and 17 are views showing the arrangement of a zoom lens as one of image sensing lenses assembled in the lens device 126. FIGS. 16 and 17 exemplify a tele-photo zoom lens with a 5-group arrangement (positive, negative, positive, positive, and negative groups). These lens groups will be referred to as first to fifth groups ZG1 to ZG5 in turn from the object side. FIG. 16 shows the state at the wide-angle end, and FIG. 17 shows the state at the tele-photo end. FIGS. 16 and 17 show ray-traces in an aperture open state. Assume that the focal length and f-number at the wide-angle end are 100 mm and 5.6, and those at the tele-photo end are 400 mm and 8.0.

As shown in FIGS. 16 and 17, the first group ZG1 includes a positive lens 511 having a convex surface facing the object side, a negative meniscus lens 512 having a convex surface facing the object side, and a positive lens 513 which is cemented to the negative meniscus lens 512 and has a surface with a stronger curvature facing the object side. The second group ZG2 includes a double-concave negative lens 521, and a positive lens 522 having a surface with a stronger curvature facing the object side. The third group ZG3 includes a positive lens 531 having a convex surface facing the image side. The fourth group ZG4 includes a double-convex positive lens 541, and a negative lens 542 which is cemented to the positive lens 541 and has a concave surface facing the object side. The fifth group ZG5 includes a positive lens 551 having a surface with a stronger curvature facing the image side, and a double-concave negative lens 552 which is cemented to the positive lens 551. A stop ZS is inserted between the second and third groups ZG2 and ZG3.

Upon zooming from the wide-angle end to the tele-photo end, the air space between the second and third groups ZG2 and ZG3 contracts while that between the first and second groups ZG1 and ZG2 expands. Furthermore, the air space between the fourth and fifth groups ZG4 and ZG5 contracts while that between the third and fourth groups ZG3 and ZG4 expands. More specifically, the first group ZG1 moves toward the object side, the second group ZG2 moves toward the image side, the third group ZG3 moves toward the object side, and the fifth group ZG5 moves toward the object side, while the fourth group ZG4 is fixed at a position with respect to an image sensing surface 501.

Since the exit pupil position varies upon zooming, the incident angle of a light ray that strikes the off-axis image sensing position changes according to the set focal length. An angle $\theta_1$ shown in FIG. 16 is an incident angle when a light beam that strikes a maximum-angle-of-view position at the wide-angle end is represented by its light amount barycenter. An angle $\theta_2$ shown in FIG. 17 is an incident angle when a light beam that strikes a maximum-angle-of-view position at the tele-photo end is represented by its light amount barycenter. Since the exit pupil position becomes closer to the image sensing surface at the wide-angle end, and it becomes farther from the image sensing surface at the tele-photo end conversely, $\theta_1 > \theta_2$. Note that the light ray incident angle at an intermediate angle of view assumes a value between the angles $\theta_1$ and $\theta_2$.

In the tele-photo zoom lens shown in FIGS. 16 and 17, when the stop ZS is set in an open aperture state, a light ray that strikes an off-axis image sensing position passes through an offset position on the stop surface. Hence, when the stop ZS is stopped down, the light ray incident angle onto the image sensing surface changes.

Figure 18:
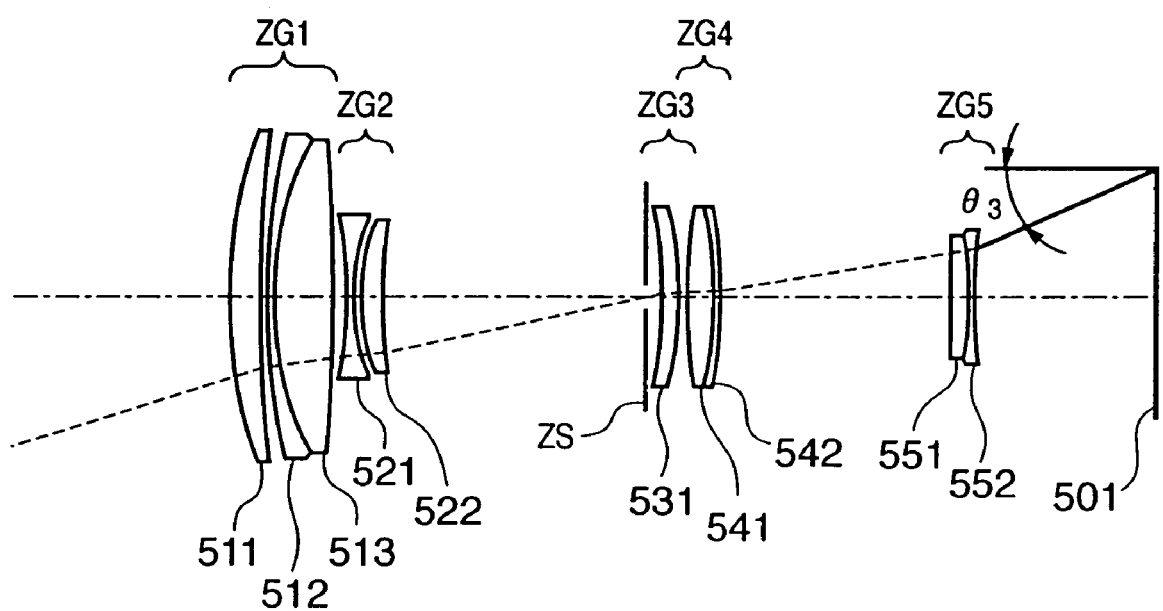
FIG. 18 is a view showing the lens arrangement of a zoom lens at the wide-angle end and ray-traces when a stop is stopped down to a point aperture.
Figure 19:
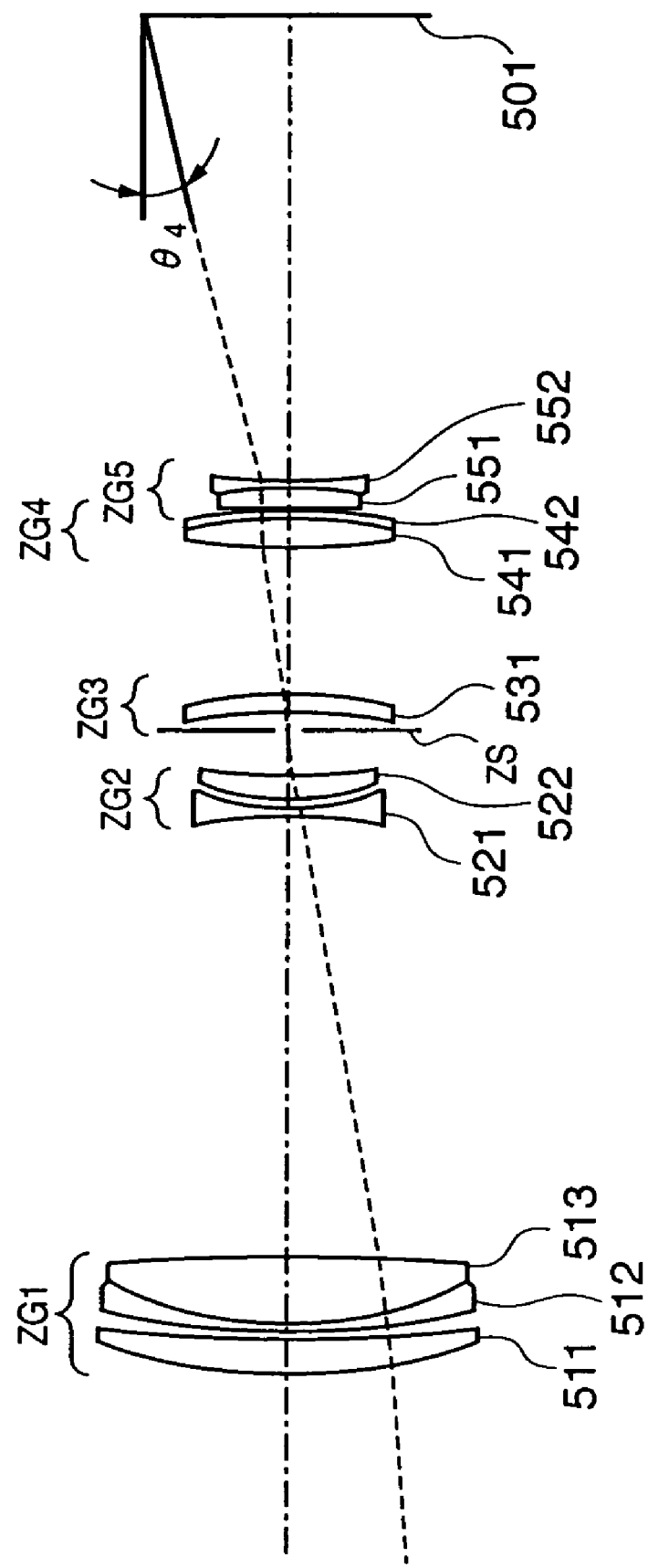
FIG. 19 is a view showing the lens arrangement of a zoom lens at the tele-photo end and ray-traces when a stop is stopped down to a point aperture.

FIGS. 18 and 19 are views showing the optical paths at the wide-angle end and tele-photo end when the stop ZS is substantially stopped down to a point aperture. An angle $\theta_3$ shown in FIG. 18 is an incident angle of a light beam which strikes a maximum-angle-of-view position at the wide-angle end, and an angle $\theta_4$ shown in FIG. 19 is an incident angle of a light beam which strikes a maximum-angle-of-view position at the tele-photo end. The magnitude relationship among the light beams which strike the maximum-angle-of-view positions are:

$$\theta_3 > \theta_1 > \theta_4 > \theta_2$$

In consideration of the degree of aperture of the stop ZS as well as the focal length, the variation width of the incident angle further broadens. The difference between the maximum and minimum angles falls within the range from 10° to 40°, although it depends on the zoom ratio and lens arrangement.

Figure 20:
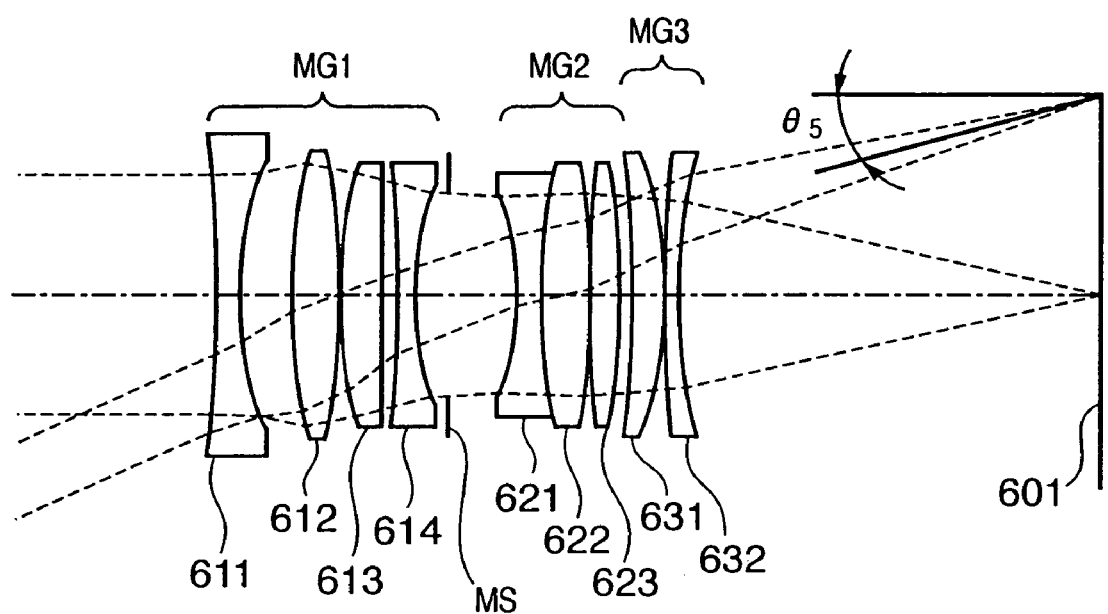
FIG. 20 is a view showing the lens arrangement of a macro lens and ray-traces upon focusing on an object at an infinity.
Figure 21:
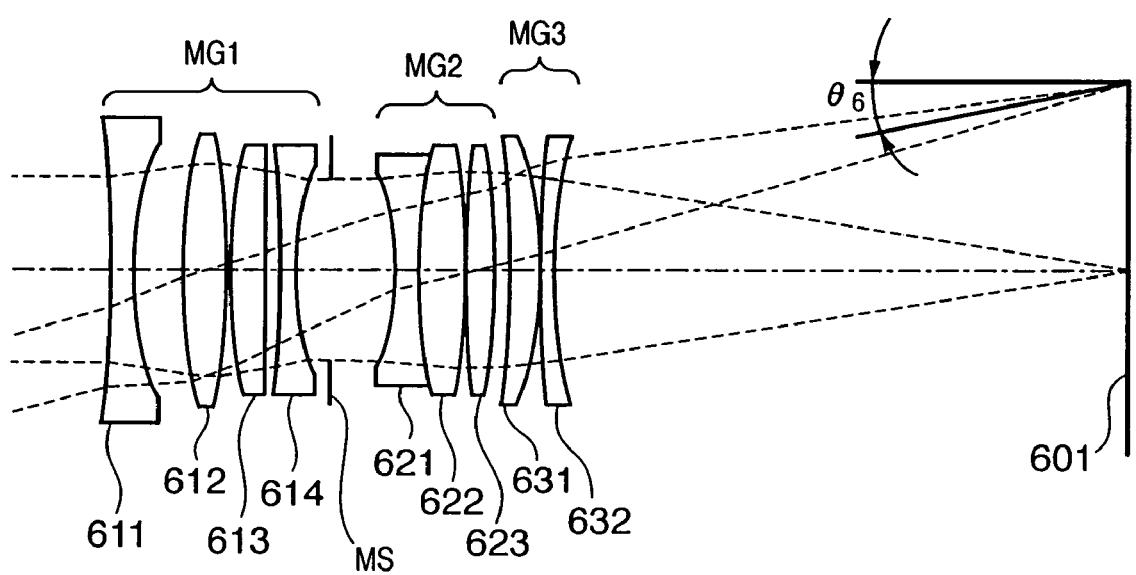
FIG. 21 is a view showing the lens arrangement of a macro lens and ray-traces upon focusing on an object at a near distance.

A change in incident angle of light rays that strikes off-axis positions takes place not only in zooming but also focusing (focus adjustment). FIGS. 20 and 21 are views showing the arrangement of a macro lens as one of image sensing lenses assembled in the lens device 126, and exemplify a lens which has a small f-number value (bright) and is suited to a single-lens reflex camera. FIG. 20 shows a state wherein a focus is adjusted to an object at the infinity, and FIG. 21 shows a state wherein a focus is adjusted to an object at the near distance (an imaging magnification=–0.2×). The focal length and f-number of the macro lens are 50 mm and 2.0, and includes first to third groups MG1 to MG3 in turn from the object side. Reference symbol MS denotes a stop.

The macro lens includes the first group MG1 having positive refracting power, the stop MS, the second group MG2 having positive refracting power, and the third group MG3 having positive refracting power. The first group MG1 includes a double-concave negative lens 611 which is arranged at a position closest to the object side, and the third group MG3 includes a negative meniscus lens 632 which is arranged at a position closest to the image side. The negative lenses 611 and 632 sandwich a so-called Gaussian type lens system between them, and a double-convex positive lens 612, a positive lens 613 having a surface with a stronger curvature facing the object side, a double-concave negative lens 614, a double-concave negative lens 621, a positive lens 622 cemented to the negative lens 621, a double-convex positive lens 623, and a positive meniscus lens 631 form the Gaussian type lens. The stop MS is arranged between the first and second groups MG1 and MG2. By arranging the negative lenses before and after the Gaussian type lens system, the entrance pupil and exit pupil get closer to each other, thus obtaining a sufficient marginal light amount.

Furthermore, this macro lens has a floating mechanism so as to obtain satisfactory optical performance for any of an object at the infinity to that at the near distance. Upon focusing on an object at the near distance from focusing on an object at the infinity, the first and second groups MG1 and MG2 are extended together, and the third group MG3 is extended to increase the air space from the second group MG2.

Since the exit pupil position varies upon focusing, the incident angle of a light ray that strikes an off-axis image sensing position changes according to the set focal length. An angle $\theta_5$ shown in FIG. 20 is an incident angle when a light beam that strikes the maximum-angle-of-view position is represented by its light amount barycenter while focusing on an object at the infinity. An angle $\theta_6$ shown in FIG. 21 is an incident angle when a light beam that strikes the maximum-angle-of-view position is represented by its light amount barycenter while focusing on an object at the near distance. Since the exit pupil position becomes closer to the image sensing surface upon focusing on an object at the infinity, and is separated away from the image sensing surface upon focusing on an object at the near distance, $\theta_5 > \theta_6$. Note that the light ray incident angle when an object is at an intermediate distance normally assumes a value between the angles $\theta_5$ and $\theta_6$.

In consideration of the degree of aperture of the stop MS as well as the distance to the object, the variation width of the incident angle further broadens. The difference between the maximum and minimum angles falls within the range from 3° to 30°, although it depends on the nearest object distance that can be focused and lens arrangement.

The structure of the image sensing element 116 will be describe below using FIGS. 22 to 25.

Figure 22:
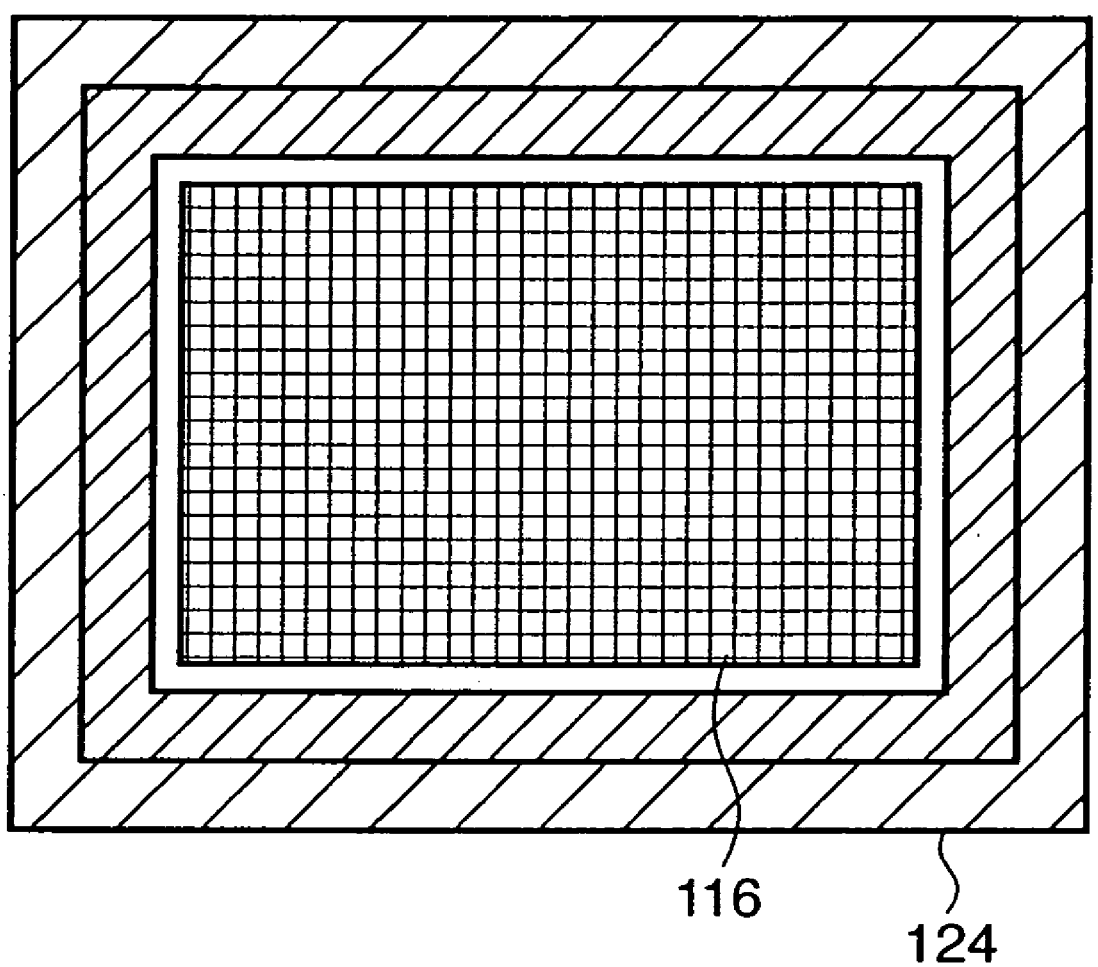
FIG. 22 is a plan view of an image sensing element according to the second embodiment of the present invention.

FIG. 22 is a plan view of the image sensing element 116 shown in FIG. 14. Referring to FIG. 22, reference numeral 116 denotes an image sensing element; and 124, a sensor package that houses the image sensing element 116. The image sensing element 116 is a CMOS image sensing element, and is formed by regularly arranging several million pixels in the vertical and horizontal directions or oblique directions so as to obtain image data for several million pixels. Therefore, the interior of the sensor package is filled up with low refractive index fluid having a refractive index of about 1.27 such as air, inert gas, or hydrofluoro ether.

Figure 23:
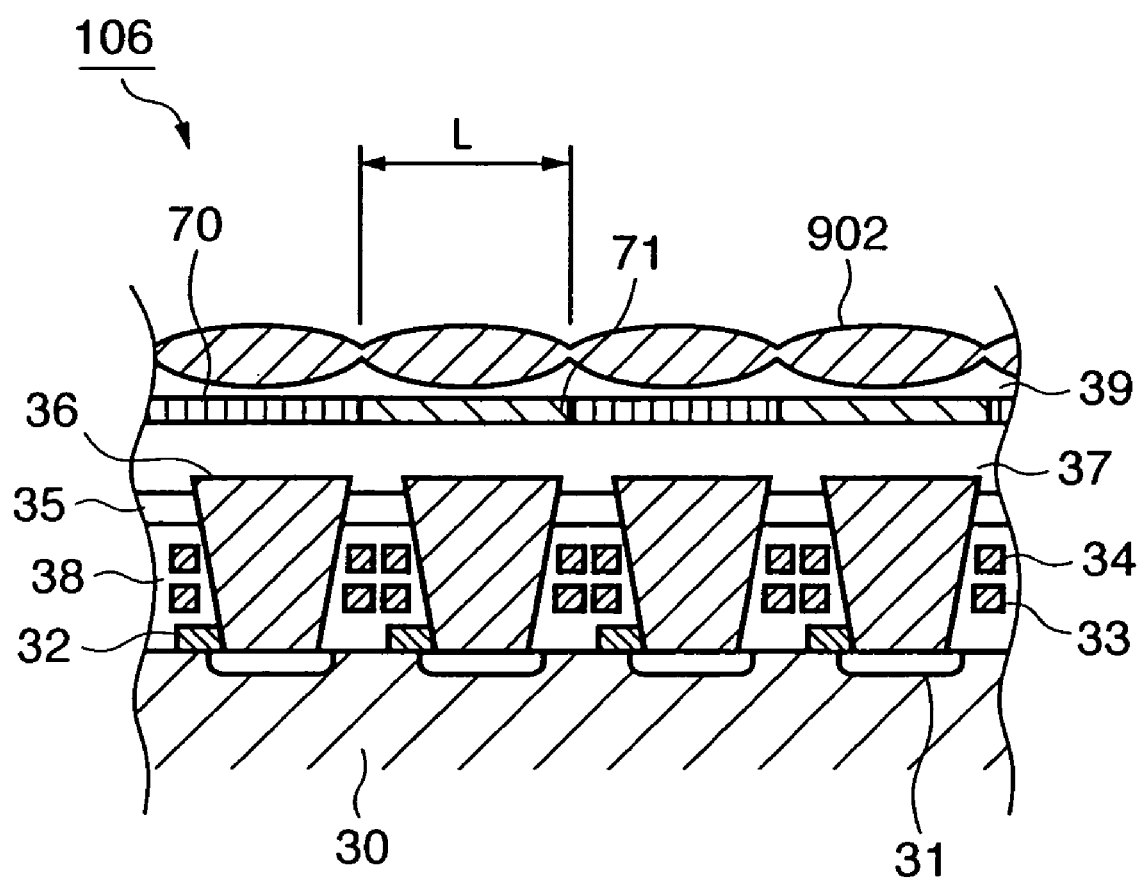
FIG. 23 is a partial sectional view of the image sensing element.

FIG. 23 is a partial sectional view of the image sensing element 116. FIG. 23 is a partially enlarged view of a peripheral portion of the image sensing element 116, in which the optical axis of the image sensing element 116 is located on the left side of this figure, and microlenses decenter in the left direction of this figure. Various types of color filter arrangements are available, and a Bayer arrangement is adopted in this case.

Referring to FIG. 23, reference numeral 70 denotes a green color filter which transmits green light; and 71, a red color filter which transmits red light. In the section of the image sensing element with the Bayer arrangement, one of a row in which the green and red color filters are alternately arranged, as shown in FIG. 23, or a row in which blue and green color filters are alternately arranged appears.

Reference numeral 30 denotes a silicon substrate; 31, a photoelectric conversion unit of each of embedded photodiodes which are regularly arranged at a pitch L; 32, a polysilicon wiring layer; 33 and 34, copper wiring layers; and 38, an insulating interlayer formed of, e.g., hydrophobic porous silica or the like. The metal wiring layers sandwich the insulating interlayer to form a kind of capacitor, which induces a signal delay. Hence, the dielectric constant of the porous silica is set to be lower than a silicon oxide film ($SiO_2$) which is popularly used in the conventional elements. Since the refractive index is proportional to the square of the dielectric constant, the refractive index is as low as about 1.3.

Reference numeral 36 denotes an embedded transparent resin layer; and 35, a protection film formed of a silicon oxynitride film (SiON).

The embedded transparent resin layer 36 is fabricated in the following processes. That is, the potential structure, the photoelectric conversion unit 31, a MOS transistor amplifier, a pixel selection transistor, the copper wiring layers 33 and 34, the insulating interlayer 38, and the like in silicon are formed first. After the protection film 35 is grown on the upper layer of that multilayered structure, anisotropic etching is applied from above the projection film 35 toward the photoelectric conversion unit 31 to form an opening. Then, a liquid transparent resin is filled into this opening and is thermally set.

The refractive index of the transparent resin layer 36 is 1.6, and forms a light guide to have a refractive index difference of about 1.2 times from the refractive index (1.3) of the insulating interlayer 38 that neighbors the transparent resin layer 36. Light rays which obliquely enter this boundary surface beyond a critical angle from the high refractive index side toward the low refractive index side is totally reflected at the boundary surface between the transparent resin layer 36 and the insulating interlayer 38.

Note that the embedded transparent resin layer 36 can be a composite material prepared by uniformly dispersing titanium oxide ($TiO_2$) particles, or silicon nitride ($Si_3N_4$) particles, niobium pentoxide ($Nb_2O_5$) particles or the like of nano scale into a base resin. With such composite material, since the titanium oxide particles, silicon nitride particles, or niobium pentoxide particles have a size sufficiently smaller than the wavelength of light, and the refractive index is as high as 2.35 for titanium oxide particles, 2.0 for silicon nitride particles, or 2.2 for niobium pentoxide particles, the refractive index can be pulled up to about 1.8 to 2.1 times from the refractive index (1.3) of the insulating interlayer 38 while maintaining rectilinear propagation of light inside the composite material, thus greatly reducing the critical angle that causes total reflection.

Figure 24:
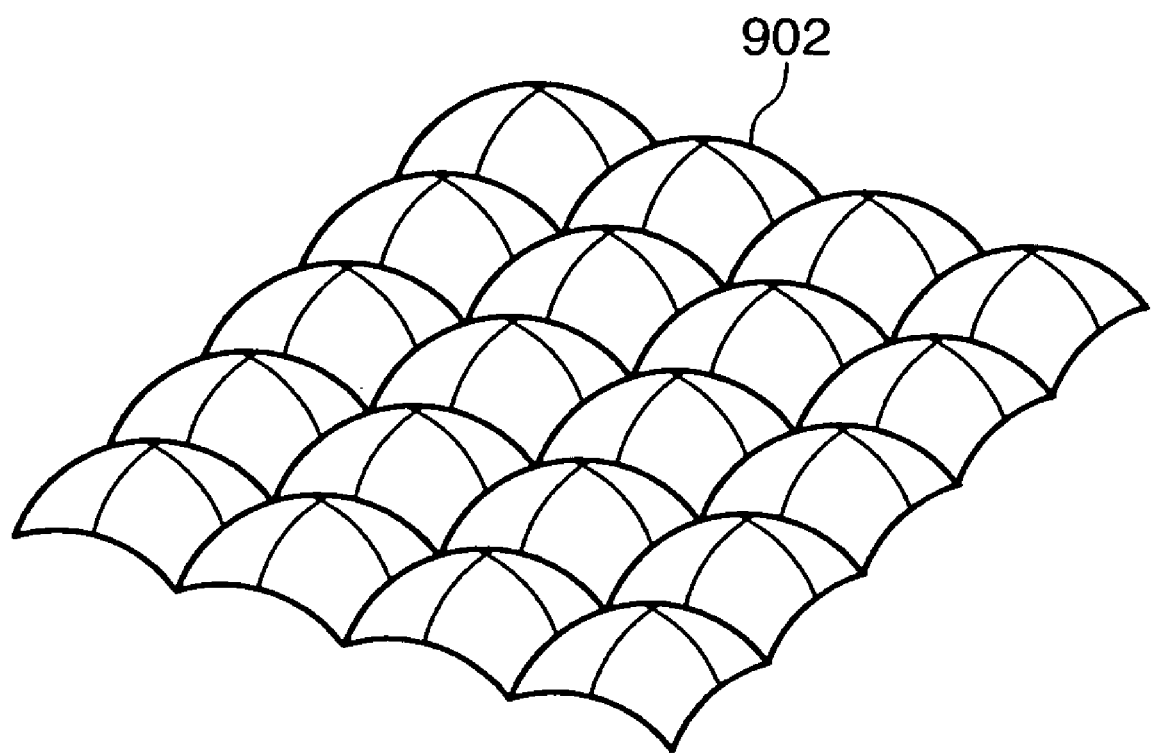
FIG. 24 is a bird's-eye view of micro convex lenses viewed from obliquely above.

Reference numerals 37 and 39 denote flattening layers; and 902, a micro convex lens. The flattening layer 37 is a transparent resin layer formed on the projection layer 35 and transparent resin layer 36. The micro convex lens 902 made of SiON is formed by etching the upper portion of the flattening layer 39 in a concave shape, forming a silicon oxynitride (SiON) layer on it, and etching its top surface in a convex shape. Each micro convex lens 902 has a square shape when viewed from the optical axis direction, and both the upper and lower surfaces of each micro convex lens 902 are aspherical surfaces which have axial symmetry. FIG. 24 is a view for explaining the shapes of the convex lenses 902, i.e., a bird's-eye view of the micro convex lenses 902 viewed from obliquely above.

Since the refractive index of the flattening layer 39 is 1.58 and that of the micro convex lens 902 is 1.8, the micro convex lens 902 has a focal length as a convergence system. Therefore, even when there is intervals between the neighboring embedded transparent resin layers 36, a light beam passes through the micro convex lenses 902 which are bedded without any interval, and is efficiently focused on any of the embedded transparent resin layers 36. Note that the micro convex lenses 902 may be fabricated by welding a resin which is molded into a cylindrical shape by etching.

In general, since the wiring layers and the like are present near the photoelectric conversion unit of the CMOS image sensing element, and a charge transfer unit and the like are present in the CCD image sensing element, light rays which obliquely travel inside the image sensing element hardly reach the photoelectric conversion unit. Light rays that cannot reach the photoelectric conversion unit are absorbed by the wiring layers and the like and are eventually converted into heat.

Figure 25:
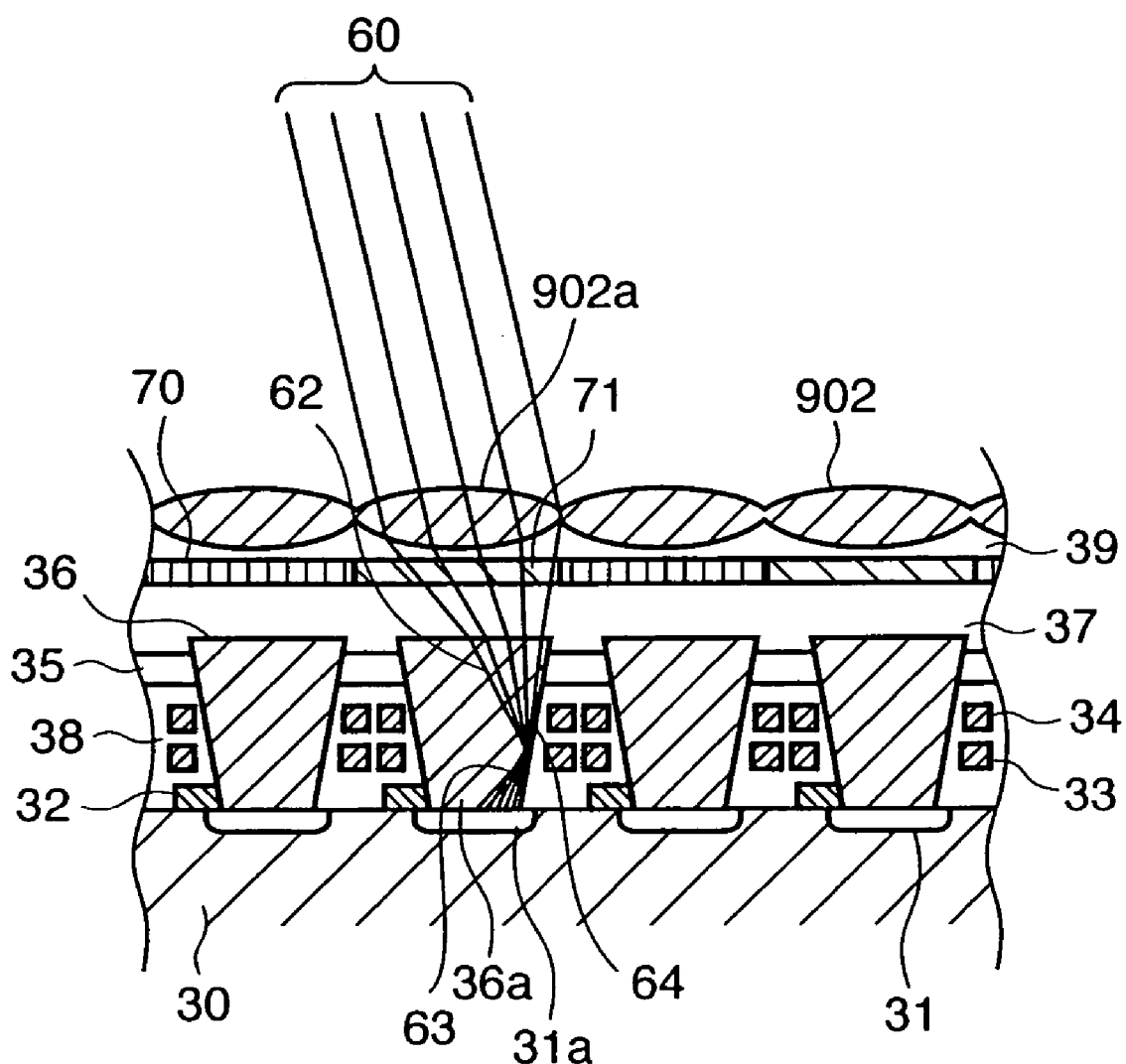
FIG. 25 is a ray-tracing diagram showing the optical path of incoming light in the image sensing element shown in FIG. 23.

As described above, the image sensing element 116 comprises the light guide structure that guides such light rays which obliquely travel inside the image sensing element 116 to the photoelectric conversion unit 31. FIG. 25 is a ray-tracing diagram typically showing the optical path of a light beam which enters a micro convex lens 902*a* of those of the light beam that enters the image sensing element 116.

Light rays 60 which come from above of the image sensing element 116 enter the micro convex lens 902*a*, undergo a refraction effect, and then enter an embedded transparent resin layer 36*a* via the flattening layer 37. Since the embedded transparent resin layer 36*a* has a refractive index higher than that of the insulating interlayer 38, light rays that obliquely enter beyond the critical angle are totally reflected by the boundary surface between the resin layer 36a and the insulating interlayer 38, and cannot leave the embedded transparent resin layer 36a to the insulating interlayer 38. More specifically, light rays 62 are totally reflected by a boundary surface 64 between the embedded transparent resin layer 36a and insulating interlayer 38, and stay inside the embedded transparent resin layer 36a as light rays 63. Then, the light rays 63 enter a photoelectric conversion unit 31a and are photoelectrically converted.

The relationship between the behavior of light rays in the light guide and the pupil position has been explained above with reference to FIGS. 2, 4, and 5. In the second embodiment as well, when the image sensing optical system 125 is "close" to the image sensing element 116, i.e., when the pupil distance is short and the incident angle θ of a light beam 330 is large (θ=α1), as shown in FIG. 4, the light beam 330 is totally reflected by the slope of the light guide 203. On the other hand, when the pupil distance is long and the incident angle θ of the light beam 330 is small (θ=α2), as shown in FIG. 5, the light beam 330 is not reflected by the slope, and is guided to the photoelectric conversion unit 201.

In this manner, the light beam can be guided to the photoelectric conversion unit using the light guide structure even when the incident angle θ changes.

Therefore, light rays, which cannot enter the photoelectric conversion unit 31 due to deviation of the exit pupil position from the image sensing element upon zooming or focusing when no embedded transparent resin layer 36 is formed, can enter the photoelectric conversion unit 31 using the light guide structure based on the embedded transparent resin layer 36 shown in FIG. 25, thus improving the sensitivity of the image sensing element on the periphery of the frame. Therefore, shading due to the image sensing element can be eliminated.

The structure of the light guide is determined based on the following properties as in the first embodiment.

1. If the image height H increases, the incident angle θ becomes larger.

2. If the pupil distance L increases, the incident angle θ becomes smaller.

3. The critical angle that causes total reflection at the boundary surface between the light guide and the insulating interlayer decreases with decreasing $N_L/N_H$, i.e., the ratio of the refractive index $N_L$ of the insulating interlayer to the refractive index $N_H$ of the light guide, and light rays incident at a larger incident angle θ can be captured.

4. If the pixel pitch P decreases, an area occupied by a circuit portion of each pixel increases, the photoelectric conversion unit size decreases relatively, and light rays incident at a larger incident angle θ cannot be captured. In case of the CMOS type solid-state image sensing element, the circuit portion includes a charge transfer MOS transistor, a reset MOS transfer for supplying a reset potential, a source-follower MOS sensor transistor, a selection MOS transistor for selectively outputting a signal from the source-follower MOS sensor transistor, and the like.

5. If the height D from the photoelectric conversion unit to the microlens increases, an angle at which the photoelectric conversion unit can be seen from the microlens decreases, and light rays with a larger incident angle θ cannot be captured.

As can be seen from these properties, an evaluation value E, which is expressed by the image height H, pupil distance L, pixel pitch P, height D, refractive index $N_H$ of the light guide, and refractive index $N_L$ of the insulating interlayer, and is given by:

$$E = \frac{H \cdot D \cdot N_L}{L \cdot P \cdot N_H} \quad (6)$$

can be an index suited to express the amount of light rays with large incident angle θ that can be guided to the photoelectric conversion unit.

For example, when
image height H=4251 [μm];
pupil distance L=15000 [μm];
pixel pitch P=3.25 [μm];
height D=5.0 [μm];
refractive index $N_L$ of insulating interlayer 211=1.46; and
refractive index $N_H$ of the light guide=1.65, E=0.39. In this way, the effect the light guide structure is great when the image height H, pupil distance L, pixel pitch P, height D, refractive index $N_H$ of the light guide, and refractive index $N_L$ of the insulating interlayer are selected to meet:

$$E<1.0 \quad (7)$$

<Third Embodiment>

The light guide can be formed by combining other materials.

In the third embodiment, in the color image sensing element with the structure shown in FIG. 23, the insulating interlayer 38 is formed of silicon oxide ($SiO_2$) and the embedded transparent layer 36 is formed of silicon nitride ($Si_3N_4$) unlike in the second embodiment.

Since the refractive index of the embedded transparent layer 36 is 2.0 and that of silicon oxide ($SiO_2$) that forms the insulating interlayer 38 that neighbors the embedded transparent layer 36 (silicon nitride) is 1.46, a refractive index difference of about 1.37 times is generated. For this reason, light rays that obliquely enter the boundary surface beyond the critical angle from the high refractive index side toward the low refractive index side can be totally reflected. With such light guide structure, obliquely coming light is efficiently guided to the photoelectric conversion unit 31.

Furthermore, in the third embodiment, the flattening layer 39 is formed using silicon oxide ($SiO_2$), and the micro convex lens 902 of titanium oxide ($TiO_2$) is formed by etching the upper portion of the flattening layer 39 in a concave shape, forming a titanium oxide ($TiO_2$) layer on top of the etched flattening layer 39, and etching the upper surface of the titanium oxide layer in a convex shape.

Since the refractive index of silicon oxide ($SiO_2$) that forms the flattening layer 39 is 1.46, and that of titanium oxide ($TiO_2$) that forms the micro convex lens 902 is 2.35, the micro convex lens 902 has a focal length as a convergence system. Therefore, even when there is intervals between the neighboring embedded transparent resin layers 36, a light beam passes through the micro convex lenses 902 which are bedded without any interval, and is efficiently focused on any of embedded transparent resin layers (silicon nitride) 36.

In this way, the same effect as in the second embodiment can be obtained by combining different materials.

Note that a silicon oxynitride (SiON) film may be used in place of silicon nitride that forms the light guide. When silicon oxynitride (SiON) is used, since the residual stress can be reduced, the probability of occurrence of film peeling or the like lowers, and the manufacturing yield of the image sensing element can be improved.

<Fourth Embodiment>

The light guide can also be formed by combining still other materials. Also, an intra-layer lens can be formed using a low refractive index layer in the image sensing element.

Figure 26:
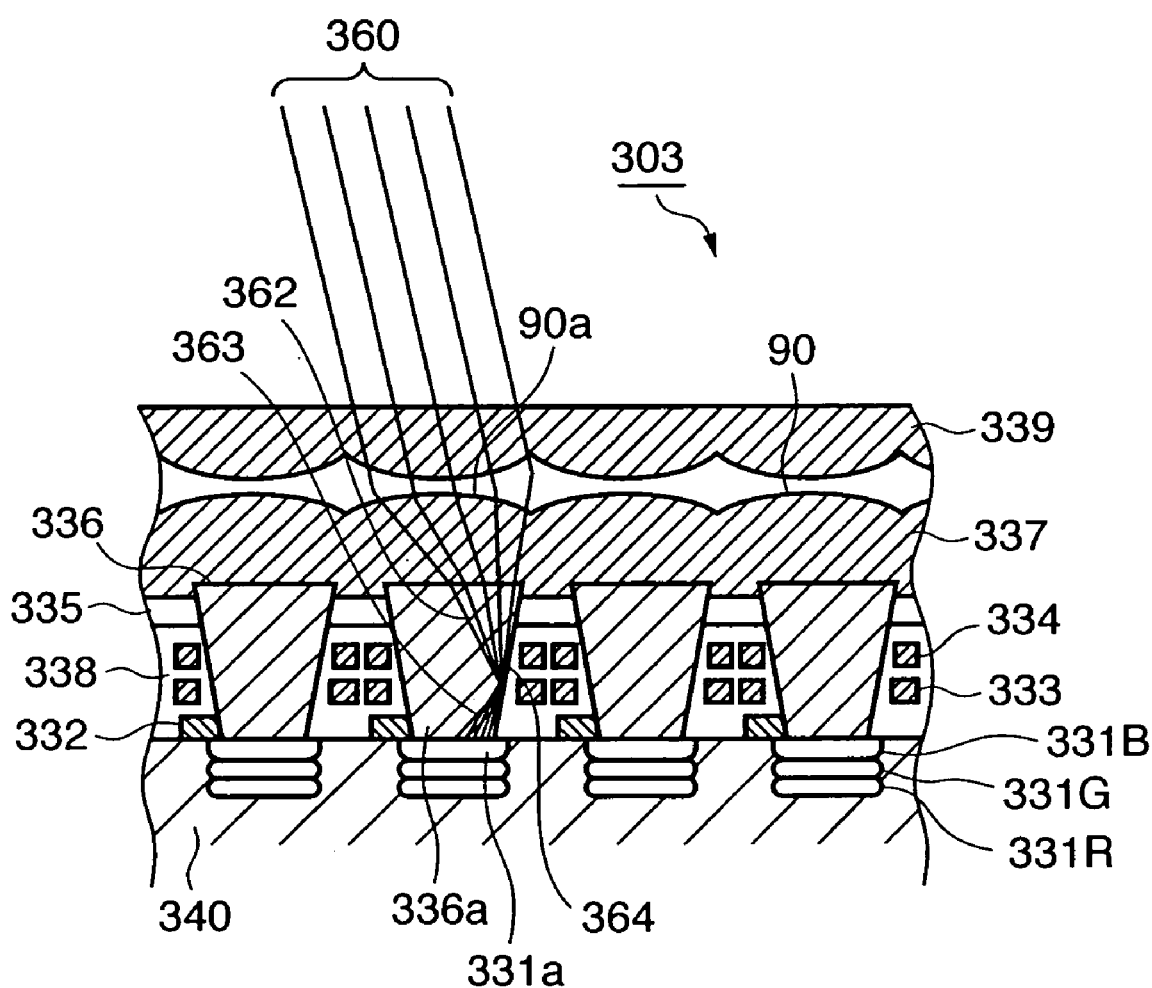
FIG. 26 is a partial sectional view of an image sensing element according to the fourth embodiment of the present invention.

FIG. 26 is a sectional view of some pixels of a color image sensing element with a light guide according to the fourth embodiment of the present invention. In FIG. 26, photoelectric conversion units each having a layer structure are formed unlike in the first and second embodiments.

Referring to FIG. 26, reference numeral 340 denotes a silicon substrate; 331B, 331G, and 331R, photoelectric conversion units of an embedded photodiode; 332, a polysilicon wiring layer; 333 and 334, copper wiring layers; and 338, hydrophobic porous silica as an insulating interlayer. Reference numeral 336 denotes an embedded silicon oxide (SiO$_2$) layer; and 335, a protection film formed of a silicon oxynitride film (SiON).

The photoelectric conversion unit 331B photoelectrically converts light of the entire visible range, the photoelectric conversion unit 331G mainly photoelectrically converts green light and red light, and the photoelectric conversion unit 331R mainly photoelectrically converts red light. The arrangement which comprises three photoelectric conversion units having different spectral sensitivities per pixel is free from occurrence of any false color since object image sampling positions for respective colors match upon obtaining a color image.

The embedded silicon oxide layer 336 is fabricated in the following processes. That is, the potential structure, the photoelectric conversion units 331B, 331G, and 331R, a MOS transistor amplifier, a pixel selection transistor, the copper wiring layers 333 and 334, the insulating interlayer 338, and the like in silicon are formed first. After the protection film 335 is grown on the upper layer of that multilayered structure, anisotropic etching is applied from above the projection film 335 toward the photoelectric conversion unit 331 to form an opening. Then, silicon oxide (SiO$_2$) is embedded in this opening by a CVD device.

The refractive index of the embedded silicon oxide layer 336 is 1.46, and has a refractive index different about 1.12 times of that (1.3) of the insulating interlayer that neighbors the embedded silicon oxide layer 336. Hence, the embedded silicon oxide layer 336 can totally reflect light rays which obliquely enter this boundary surface beyond the critical angle from the high refractive index side toward the low refractive index side. With this light guide structure, obliquely incoming light is efficiently guided to the photoelectric conversion units 331B, 331G, and 331R.

Furthermore, reference numeral 337 denotes a flattening layer; 90, an intra-layer lens; and 339, a flattening layer formed of a transparent resin. The flattening layer 337 is formed of silicon oxynitride (SiON) which is formed on the protection layer 335 and embedded silicon oxide layer 336. The intra-layer lens 90 of hydrophobic porous silica is formed by etching the upper portion of the flattening layer 337, forming a hydrophobic porous silica layer on that upper portion, and then etching the upper surface of the hydrophobic porous silica layer in a concave shape. Each intra-layer lens 90 has a square shape when viewed from the optical axis direction, and both the upper and lower surfaces of each intra-layer lens 90 are aspherical surfaces which have axial symmetry.

Since the refractive index of the flattening layer 337 is 1.80, that of the intra-layer lens 90 is 1.30, and that of the flattening layer 339 is 1.58, the intra-layer lens 90 has a focal length as a convergence system although it is a double-concave lens. Therefore, even when there is intervals between the neighboring embedded silicon oxide layers 336, a light beam passes through the intra-layer lenses 90 which are bedded without any interval, and can be efficiently focused on any of the embedded silicon oxide layers 336.

FIG. 26 includes a ray-tracing diagram that typically shows the optical path of a light beam which enters an intra-layer lens 90$a$. Light rays 360 that enter the intra-layer lens 90$a$ are refracted by the intra-layer lens 90$a$, and then enter an embedded silicon oxide layer 336$a$ via the flattening layer 337. Since the embedded silicon oxide layer 336$a$ has a higher refractive index than that of the insulating interlayer 338, light rays that obliquely enter beyond the critical angle are totally reflected by the boundary surface between the embedded silicon oxide layer 336$a$ and the insulating interlayer 338, and cannot leave the embedded silicon oxide layer 336$a$ to the insulating interlayer 338. More specifically, light rays 362 are totally reflected by a boundary surface 364 between the embedded silicon oxide layer 336$a$ and insulating interlayer 338, and stay inside the embedded silicon oxide layer 336$a$ as light rays 363. Then, the light rays 363 enter a photoelectric conversion unit 331$a$ and are photoelectrically converted.

As described above, according to the fourth embodiment, the same effect as in the second embodiment can be obtained.

Note that the second to fourth embodiments have explained the light guide structure which causes total reflection by utilizing the refractive index difference of materials. Alternatively, a light guide using metal surface reflection may be used. Also, a gap sealed with a gas or a vacuum gap may be used in place of the insulating interlayer.

<Fifth Embodiment>

The fifth embodiment of the present invention will be described below.

Since the fifth embodiment uses the lens-exchangeable digital camera system which has been explained using FIGS. 31 and 12, a description thereof will be omitted.

In such lens-exchangeable digital camera system, since the exit pupil position varies depending on the focal length or the like of an exchangeable lens mounted on the camera body 1200, a light beam that can be received by, especially, pixels of a peripheral portion of the image sensor 1208, changes depending on the exchangeable lens to be mounted.

Figure 27:
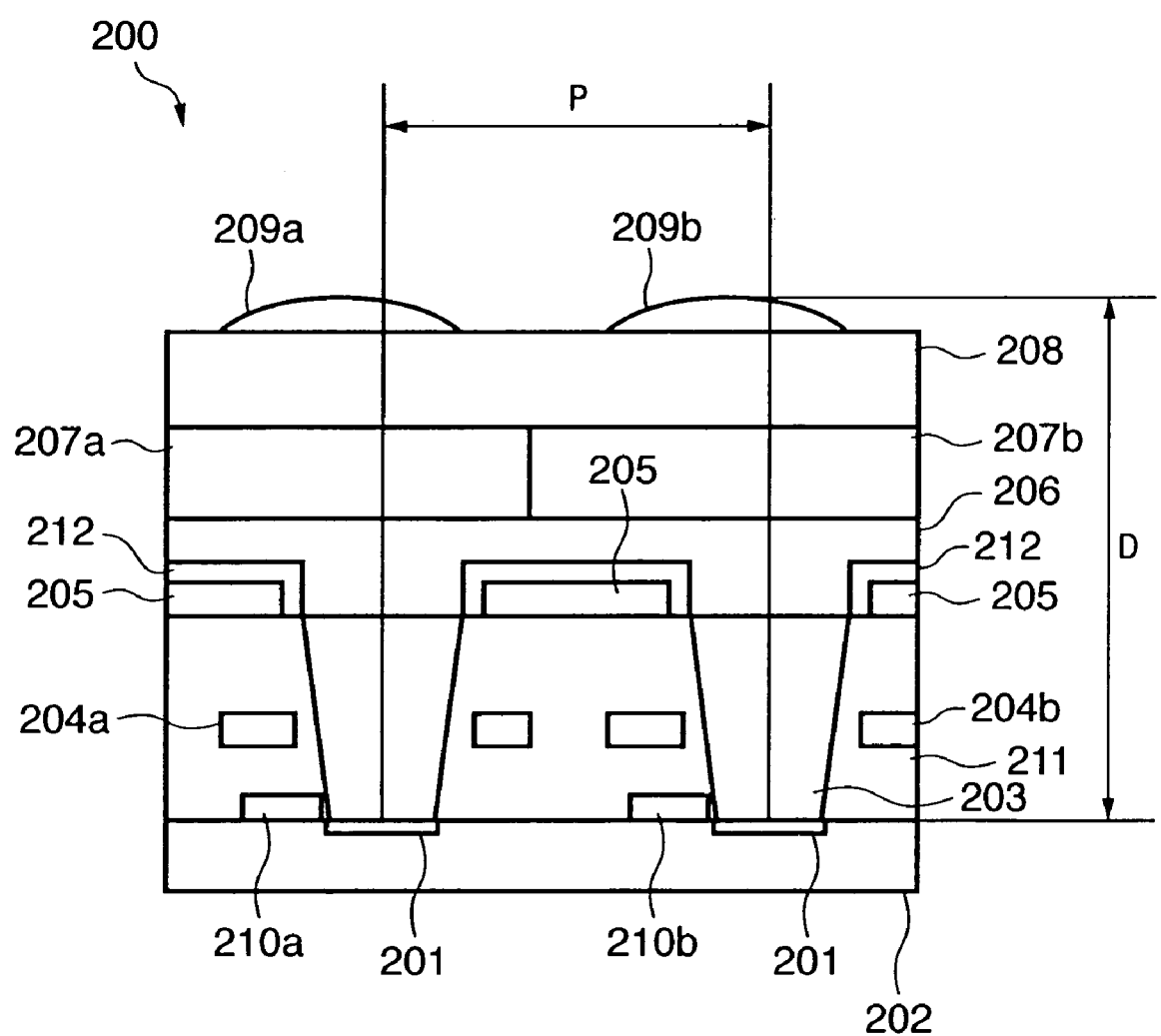
FIG. 27 is a sectional view showing the structure of a CMOS type solid-state image sensing element.
Figure 28:
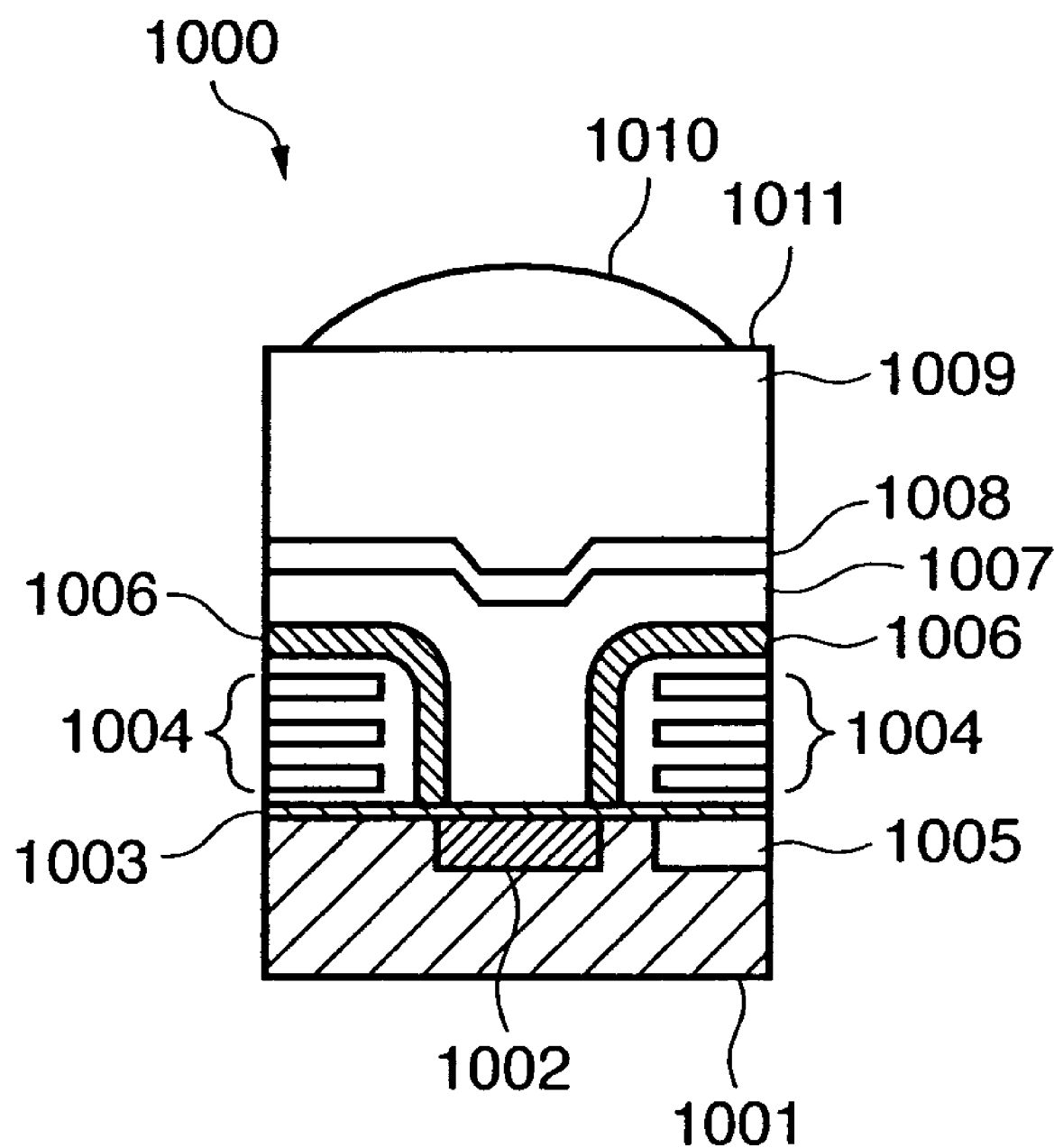
FIG. 28 is a schematic sectional view showing the structure of a conventional CCD type solid-state image sensing element.
Figure 29:
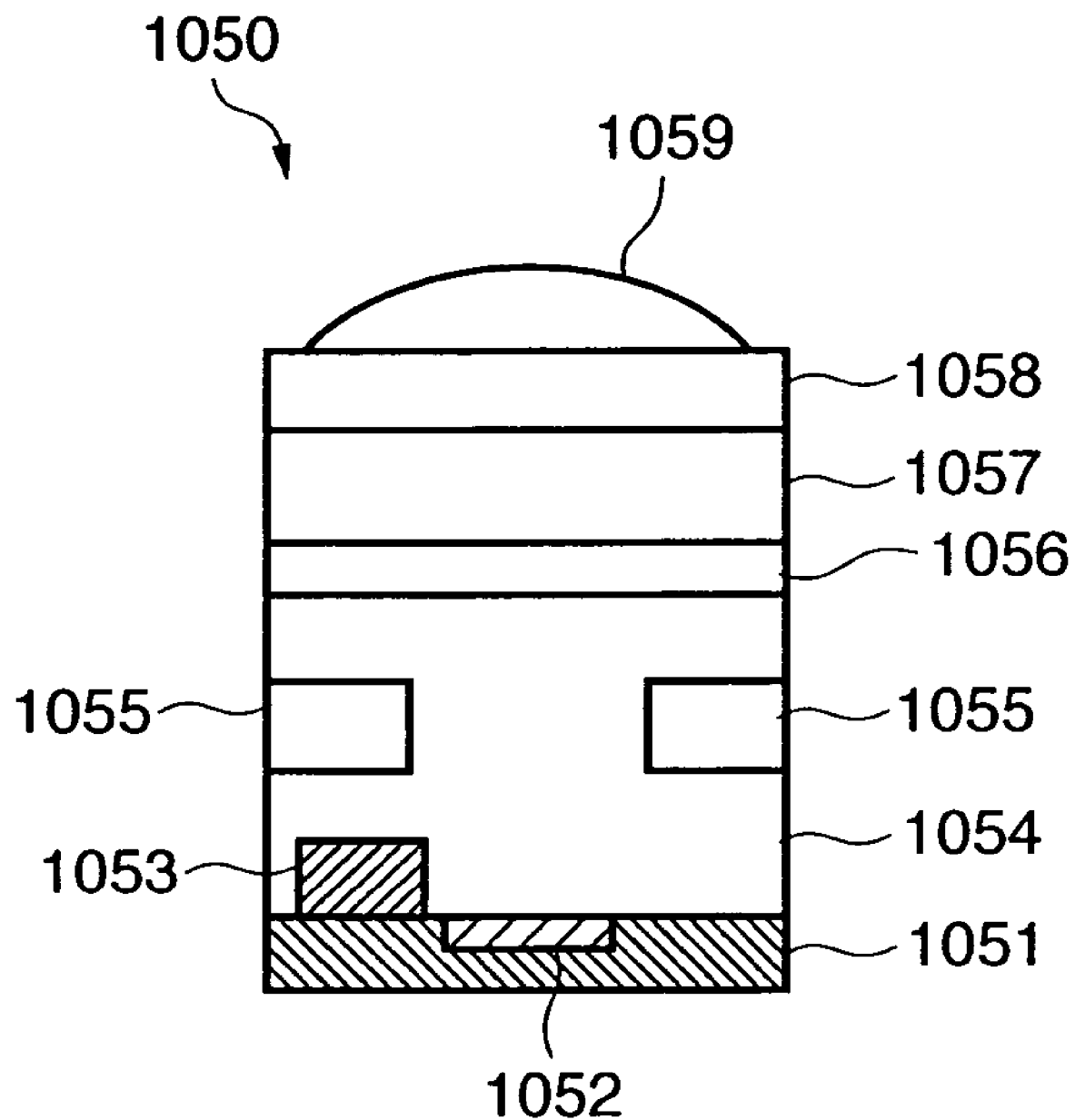
FIG. 29 is a schematic sectional view showing the structure of a conventional CMOS type solid-state image sensing element.

FIG. 27 is an element sectional view of the CMOS solid-state image sensing element 200 used as the image sensor 1208 of the camera body 1200, which is arranged on the prospective imaging surface of the wide-angle lens 420. As shown in FIG. 27, the image sensing element 200 has a light guide. Note that the same reference numerals in FIG. 27 denote the same parts as in FIG. 3.

Referring to FIG. 27, reference numeral 201 denotes a photoelectric conversion unit; 202, a silicon (Si) substrate on which the photoelectric conversion unit 201 is formed; and 203, a light guide made of SiN or the like as a material having a high refractive index. The central axis of the light guide 203 substantially agrees with that of the photoelectric conversion unit 201. The light entrance side of the light guide 203 is formed to have a broader opening so as to receive more light components. Reference numeral 210 denotes a transfer electrode which is formed in an insulating interlayer 211 made of SiO$_2$ or the like with a low refractive index, and is used to transfer a photo charge generated by the photoelectric conversion unit 201 to a floating diffusion (FD) unit (not shown); and 204 and 205, wiring electrodes which are formed to selectively read out charges generated by the photoelectric conversion unit 201. Normally, the transfer electrode 210 is made of polysilicon (Poly-Si), and the wiring electrodes 204 and 205 are made of aluminum (Al).

Reference numeral 206 denotes a flattening layer which is formed on an uneven surface due to electrodes and wiring layers (not shown) to provide a flat surface. A color filter 207 is formed on the flattening layer 206, and a microlens 209 is also formed on the flattening layer 208. The microlens 209 is arranged to efficiently focus light coming from the exchangeable lens 420 on the photoelectric conversion unit 201.

In FIG. 27, light transmitted through the microlens 209 passes through the flattening layer 208, and undergoes wavelength selection in the color filter layer 207. For example, when the color filter layer 207 of the left pixel in FIG. 27 transmits a green light component, blue and red light components are absorbed. When the color filter layer 207 of the right pixel in FIG. 27 transmits a blue light component, green and red light components are absorbed. Light of a predetermined wavelength, which has been transmitted through the color filter layer 207 is transmitted through the light guide 203 formed of a transparent material with a high refractive index (refractive index $N_H$) such as silicon nitride (SiN) or the like, and is guided to the photoelectric conversion unit 201. Since the insulating interlayer 211 is formed around the light guide 203 using a transparent material with a low refractive index (refractive index $N_L$) such as silicon oxide (SiO$_2$) or the like, light that goes from the light guide 203 toward the insulating interlayer 211 is totally reflected by a boundary surface between the light guide 203 and insulating interlayer 211, and is guided to the photoelectric conversion unit 201. The refractive index $N_L$ of the insulating interlayer 211 formed of silicon oxide (SiO$_2$) is, e.g., 1.46.

Let P be the spacing (pixel pitch) between neighboring pixels, and D be the height from the apex of the microlens 209 to the photoelectric conversion unit 201.

The light collecting characteristics of the solid-state image sensing element 200 with the light guide, as shown in FIG. 27, are as has already been described above with reference to FIGS. 2, 4, and 5. In case of the solid-state image sensing element 200 with the light guide 203, as shown in FIG. 4, even when the indent angle $\theta=\alpha 1$ of an object light beam 330 with respect to an optical axis 321 is large (when the pupil distance L is short), the light is totally reflected by a slope of the light guide 203, and is efficiently guided to the photoelectric conversion unit 201.

When the pupil distance L of the image sensing optical system 101 is long and the indent angle $\theta=\alpha 2$ of the object light beam 330 with respect to the optical axis 321 is small, as shown in FIG. 5, the object light 330 directly enters the photoelectric conversion unit 201 without being reflected by the slope of the light guide 203.

In order to improve the focusing effect even in case of an object light beam which has a large incident angle to the solid-state image sensing element 200, the structure of the light guide is determined based on the following properties.

1. If the image height H increases, the incident angle $\theta$ becomes larger.

2. If the pupil distance L increases, the incident angle $\theta$ becomes smaller.

3. The critical angle that causes total reflection at the boundary surface between the light guide and the insulating interlayer decreases with decreasing $N_L/N_H$, i.e., the ratio of the refractive index $N_L$ of the insulating interlayer to the refractive index $N_H$ of the light guide, and light rays incident at a larger incident angle $\theta$ can be captured.

4. If the pixel pitch P decreases, an area occupied by a circuit portion of each pixel increases, the photoelectric conversion unit size decreases relatively, and light rays incident at a larger incident angle $\theta$ cannot be captured. In case of the CMOS type solid-state image sensing element, the circuit portion includes a charge transfer MOS transistor, a reset MOS transfer for supplying a reset potential, a source-follower MOS sensor transistor, a selection MOS transistor for selectively outputting a signal from the source-follower MOS sensor transistor, and the like.

5. If the height D from the photoelectric conversion unit to the microlens increases, an angle at which the photoelectric conversion unit can be seen from the microlens decreases, and light rays with a larger incident angle $\theta$ cannot be captured.

As can be seen from these properties, an evaluation value E, which is expressed by the image height H, pupil distance L, pixel pitch P, height D, refractive index $N_H$ of the light guide, and refractive index $N_L$ of the insulating interlayer, and is given by:

$$E = \frac{H \cdot D \cdot N_L}{L \cdot P \cdot N_H} \tag{6}$$

can be an index suited to express the amount of light rays with large incident angle $\theta$ that can be guided to the photoelectric conversion unit. Note that the effect of the light guide structure is great when the image height H, pupil distance L, pixel pitch P, height D, refractive index $N_H$ of the light guide, and refractive index $N_L$ of the insulating interlayer are selected to meet:

$$E<1.0 \tag{7}$$

It is ideal that the lens-exchangeable digital camera system uses a solid-state image sensing element having a light guide that can efficiently focus object light independently of an exchangeable lens mounted on the camera body. The light guide is formed based on inequality (2) using lens information of an exchangeable lens that can be mounted on the camera.

In the lens-exchangeable digital camera system shown in FIG. 12 in the fifth embodiment, the frame size of the image sensor 1208 to be mounted is substantially equal to the APS-C size (about 17×25 mm) as the film size of a silver halide camera. Hence, the image height H of pixels located at corners of the frame is about 15 mm.

Also, the height D from the apex of the microlens to the photoelectric conversion unit of the solid-state image sensing element used in the image sensor 1208 is about 0.006 mm.

The insulating interlayer filled around the light guide formed in the image sensor 1208 normally uses silicon oxide (SiO$_2$), and its refractive index $N_L$ is 1.46. Also, the light guide is normally formed of silicon nitride (SiN), and its refractive index $N_H$ is 2.0. Note that silicon oxide and silicon nitride are merely an example, and the present invention is not limited to these specific materials.

FIG. 13 is an explanatory view of an incoming light beam to the image sensor 1208 when the image sensor using the solid-state image sensing element with the aforementioned structure is applied to the lens-exchangeable digital camera system shown in FIG. 12. In FIG. 13, the wide-angle lens 420 is mounted as the exchangeable lens.

In FIG. 13, an exit pupil 425 of the retrofocus type wide-angle lens 420 is formed at the position of a distance $L_w$ close to the image sensor 1208. An object light beam that has been transmitted through the exit pupil 425 of the wide-angle lens 420 enters the image sensor 1208 at the position of the image height H. At this time, an incident angle $\theta_w$ of a chief ray to the image sensor 1208 satisfies:

$$\tan \theta_w = H/L_w$$

FIG. 11 is an explanatory view of incoming light to the image sensor 1208 which is arranged in the digital camera system which mounts the tele-photo lens 1220 shown in FIG. 17 as an exchangeable lens.

As shown in FIG. 11, an exit pupil 1225 of the tele-photo lens 1220 is formed at the position of a distance $L_t$ farther from the image sensor 1208 than when the wide-angle lens 420 shown in FIG. 12 is mounted. An object light beam that has been transmitted through the exit pupil 1225 enters the sensor 1208 at the position of the image height H. At this time, an incident angle $\theta_t$ of a chief ray to the image sensor 1208 satisfies:

$$\tan \theta_t = H/L_t$$

As can be seen from FIGS. 11 and 13, the chief ray angle $\theta_w$ when the wide-angle lens is mounted on the camera and the chief ray angle $\theta_t$ when the tele-photo lens is mounted meet:

$$\theta_w > \theta_t$$

and the incident angle θ of the chief ray to the image sensor 1208 when the wide-angle lens is mounted is larger. Therefore, the structure of the light guide is determined using exit pupil information of a lens which has a shorter exit pupil distance from the image field of exchangeable lenses that can be mounted on the camera. If the exit pupil distance L of a lens having a shorter exit pupil distance from the image height of the exchangeable lenses that can be mounted on the camera is about 60 mm (other conditions are the same as those described above), the relationship between the pixel pitch P of the image sensor 1208 and the evaluation value E is calculated based on equation (6) by:

$$E \times P = 0.0011 \, [\text{mm}]$$

Since the resolution improves with decreasing pixel pitch P of the image sensor 1208, if the pixel pitch P is set to be 0.003 mm, the evaluation value E is:

$$E = 0.37$$

which satisfies inequality (7).

In this way, when the light guide of the solid-state image sensing element 200 to be mounted on the lens-exchangeable digital camera system is formed to satisfy equation (6) and inequality (7) using exchangeable lens information, light transmitted through the light guide is totally reflected by the boundary surface between the light guide and the insulating interlayer and is efficiently focused on the photoelectric conversion unit. As a result, a high-quality image can be obtained, and a high-resolution image can also be obtained since a solid-state image sensing element with a smaller pixel size can be adopted.

In the fifth embodiment, the structure of the light guide formed in the solid-state image sensing element is determined based on the exit pupil information of an exchangeable lens that can be mounted on the camera. Also, it is effective to determine the structure of the light guide in consideration of an open F-value in addition to the exit pupil information of an exchangeable lens.

As described above, according to the fifth embodiment, in the lens-exchangeable digital camera system, since the light collecting efficiency is improved by forming the light guide that considers the moving range of the exit pupils of exchangeable lenses above the photoelectric conversion unit of the solid-state image sensing element, a high-quality image can be obtained. In addition, a high-resolution image can be obtained by reducing the pixel size per pixel.

<Other Embodiments>

The invention can be implemented by supplying a software program, which implements the function of executing a simulation for designating a solid-state image sensing element described in the first embodiment, directly or indirectly to a system or apparatus, reading the supplied program code with a computer of the system or apparatus, and then executing the program code. In this case, so long as the system or apparatus has the functions of the program, the mode of implementation need not rely upon a program.

Accordingly, since the functions of the present invention are implemented by computer, the program code installed in the computer also implements the present invention. In other words, the claims of the present invention also cover a computer program for the purpose of implementing the functions of the present invention.

In this case, so long as the system or apparatus has the functions of the program, the program may be executed in any form, such as an object code, a program executed by an interpreter, or scrip data supplied to an operating system.

Example of storage media that can be used for supplying the program are a floppy disk, a hard disk, an optical disk, a magneto-optical disk, a CD-ROM, a CD-R, a CD-RW, a magnetic tape, a non-volatile type memory card, a ROM, and a DVD (DVD-ROM and a DVD-R).

As for the method of supplying the program, a client computer can be connected to a website on the Internet using a browser of the client computer, and the computer program of the present invention or an automatically-installable compressed file of the program can be downloaded to a recording medium such as a hard disk. Further, the program of the present invention can be supplied by dividing the program code constituting the program into a plurality of files and downloading the files from different websites. In other words, a WWW (World Wide Web) server that downloads, to multiple users, the program files that implement the functions of the present invention by computer is also covered by the claims of the present invention.

It is also possible to encrypt and store the program of the present invention on a storage medium such as a CD-ROM, distribute the storage medium to users, allow users who meet certain requirements to download decryption key information from a website via the Internet, and allow these users to decrypt the encrypted program by using the key information, whereby the program is installed in the user computer.

Besides the cases where the aforementioned functions according to the embodiments are implemented by executing the read program by computer, an operating system or the like running on the computer may perform all or a part of the actual processing so that the functions of the foregoing embodiments can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application Nos. 2004-114360 filed on Apr. 8, 2004, 2004-210379 filed on Jul. 16, 2004 and 2004-214617, filed on Jul. 22, 2004, which are hereby incorporated by reference herein.

What is claimed is:

1. A solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, wherein said solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of said solid-state image sensing elements, H is a distance from a center of the image sensor to a position of said solid-state image sensing element on the image sensor, D is a height from said photoelectric conversion element to an apex of the microlens, P is a spacing between the plurality of solid-state image sensing elements, $N_H$ is a refractive index of the light guide, and $N_L$ is a refractive index of the insulating interlayer.

2. A design support method for supporting to design a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprising:

a condition acquisition step of acquiring at least some of conditions including a distance L from an exit pupil of an image sensing optical system of an image sensing device, which mounts an image sensor formed by two-dimensionally arranging a plurality of said solid-state image sensing elements, a distance H from a center of the image sensor to a position of said solid-state image sensing element on the image sensor, a height D from the photoelectric conversion element to an apex of the microlens, a spacing P between the plurality of solid-state image sensing elements, a refractive index $N_H$ of the light guide, and a refractive index $N_L$ of the insulating interlayer;

a determination step of determining if all the conditions can be acquired in said condition acquisition step;

a calculation step of computing, when it is determined in the determination step that all the conditions can be acquired, $$\frac{H \cdot D}{L \cdot P} < a \cdot \frac{N_H}{N_L}$$

and calculating a;

a computing step of computing, when it is determined in the determination step that all the conditions cannot be acquired, a value which satisfies 0<a<1 for a condition which cannot be acquired; and a notifying step of notifying the calculated a value or the value computed in the computing step.

3. The method according to claim 2, wherein the distance H is a distance from the center of the image sensor to the solid-state image sensing element which is located at a most peripheral position of the image sensor.

4. The method according to claim 2, wherein the exit pupil position of the image sensing optical system of the image sensing device can be changed, and the distance L is a distance from the exit pupil position closest to the image sensor.

5. The method according to claim 2, wherein the image sensing optical system of the image sensing device is exchangeable, and the distance L is a distance from the exit pupil position closest to the image sensor when an image sensing optical system, which has an exit pupil closest to the image sensor of image sensing optical systems that can be mounted on the image sensing device, is mounted.

6. A storage medium which is readable by an information processing apparatus storing a program which can be executed by the information processing apparatus and has a program code for implementing a design support method of claim 2.

7. A design support apparatus for supporting to design a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprising:

a condition acquisition unit that acquires at least some of conditions including a distance L from an exit pupil of an image sensing optical system of an image sensing device, which mounts an image sensor formed by two-dimensionally arranging a plurality of said solid-state image sensing elements, a distance H from a center of the image sensor to a position of said solid-state image sensing element on the image sensor, a height D from the photoelectric conversion element to an apex of the microlens, a spacing P between the plurality of solid-state image sensing elements, a refractive index $N_H$ of the light guide, and a refractive index $N_L$ of the insulating interlayer;

a determination unit that determines if all the conditions can be acquired by said condition acquisition unit;

a computing unit that computes, when said determination unit determines that all the conditions can be acquired, $$\frac{H \cdot D}{L \cdot P} < a \cdot \frac{N_H}{N_L}$$

and calculates a, and that computes, when said determination unit determines that all the conditions cannot be acquired, a value which satisfies 0<a<1 for a condition which cannot be acquired; and a notifying unit that notifies the calculated a value or the value computed by said computing unit.

8. A solid-state image sensing element comprising:

a photoelectric conversion element which converts incoming light into an electrical signal in accordance with an amount of the light;

a microlens which is arranged on an incident surface;

a light guide which is arranged between said photoelectric conversion element and said microlens, and is formed of a composite material prepared by dispersing in resin one of titanium oxide ($TiO_2$), silicon nitride ($Si_3N_4$), and niobium pentoxide ($Nb_2O_5$); and an insulating interlayer which is arranged around said light guide and is formed of hydrophobic porous silica, wherein said solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of said solid-state image sensing elements, H is a distance from a center of the image sensor to a position of said solid-state image sensing element on the image sensor, D is a height from said photoelectric conversion element to an apex of said microlens, P is a spacing between the plurality of solid-state image sensing elements, $N_H$ is a refractive index of said light guide, and $N_L$ is a refractive index of said insulating interlayer.

9. The element according to claim 8, further comprising a flattening layer which is arranged between said microlens and said light guide, and is formed of silicon oxide ($SiO_2$), wherein said microlens is formed of titanium oxide ($TiO_2$).

10. The element according to claim 8, further comprising a flattening layer which is arranged between said microlens and said light guide, and is formed of silicon oxynitride (SiON), wherein said microlens is a double-concave intra-layer lens formed of hydrophobic porous silica.

11. The element according to claim 8, wherein said photoelectric conversion element is formed of a plurality of photoelectric conversion layers having different spectral sensitivities.

12. A solid-state image sensing element comprising:

a photoelectric conversion element which converts incoming light into an electrical signal in accordance with an amount of the light;

a microlens which is arranged on an incident surface;

a light guide which is arranged between said photoelectric conversion element and said microlens, and is formed of a material selected from silicon nitride ($Si_3N_4$) and silicon oxynitride (SiON); and an insulating interlayer which is arranged around said light guide and is formed of silicon oxide ($SiO_2$), wherein said solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of said solid-state image sensing elements, H is a distance from a center of the image sensor to a position of said solid-state image sensing element on the image sensor, D is a height from said photoelectric conversion element to an apex of said microlens, P is a spacing between the plurality of solid-state image sensing elements, $N_H$ is a refractive index of said light guide, and $N_L$ is a refractive index of said insulating interlayer.

13. The element according to claim 12, further comprising a flattening layer which is arranged between said microlens and said light guide, and is formed of silicon oxide ($SiO_2$), wherein said microlens is formed of titanium oxide ($TiO_2$).

14. The element according to claim 12, further comprising a flattening layer which is arranged between said microlens and said light guide, and is formed of silicon oxynitride (SiON), wherein said microlens is a double-concave intra-layer lens formed of hydrophobic porous silica.

15. The element according to claim 12, wherein said photoelectric conversion element is formed of a plurality of photoelectric conversion layers having different spectral sensitivities.

16. A solid-state image sensing element comprising:

a photoelectric conversion element which converts incoming light into an electrical signal in accordance with an amount of the light;

a microlens which is arranged on an incident surface;

a light guide which is arranged between said photoelectric conversion element and said microlens, and is formed of silicon oxide ($SiO_2$); and an insulating interlayer which is arranged around said light guide and is formed of hydrophobic porous silica, wherein said solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of said solid-state image sensing elements, H is a distance from a center of the image sensor to a position of said solid-state image sensing element on the image sensor, D is a height from said photoelectric conversion element to an apex of said microlens, P is a spacing between the plurality of solid-state image sensing elements, $N_H$ is a refractive index of said light guide, and $N_L$ is a refractive index of said insulating interlayer.

17. The element according to claim 16, further comprising a flattening layer which is arranged between said microlens and said light guide, and is formed of silicon oxide ($SiO_2$), wherein said microlens is formed of titanium oxide ($TiO_2$).

18. The element according to claim 16, further comprising a flattening layer which is arranged between said microlens and said light guide, and is formed of silicon oxynitride (SiON),
wherein said microlens is a double-concave intra-layer lens formed of hydrophobic porous silica.

19. The element according to claim 16, wherein said photoelectric conversion element is formed of a plurality of photoelectric conversion layers having different spectral sensitivities.

20. An image sensing apparatus which has a solid-state image sensing element having a photoelectric conversion element which converts incoming light into an electrical signal in accordance with an amount of the light, a microlens which is arranged on an incident surface, a light guide which is arranged between the photoelectric conversion element and the microlens, and an insulating interlayer which is arranged around the light guide, comprising:
an attachment/detachment unit that allows an exchangeable lens to attach/detach to/from said image sensing apparatus,
wherein said solid-state image sensing element located at a distance (H) satisfies:

$$\frac{H \cdot D}{L \cdot P} < a \cdot \frac{N_H}{N_L} \text{ for } 0 < a < 1$$

where L is a distance from an exit pupil of an image sensing optical system of an image sensing device, which mounts an image sensor formed by two-dimensionally arranging a plurality of said solid-state image sensing elements, H is a distance from a center of the image sensor to a position of said solid-state image sensing element on the image sensor, D is a height from said photoelectric conversion element to an apex of the microlens, P is a spacing between the plurality of solid-state image sensing elements, $N_H$ is a refractive index of the light guide, and $N_L$ is a refractive index of the insulating interlayer.

* * * * *

UNITED STATES PATENT AND TRADEMARK OFFICE
CERTIFICATE OF CORRECTION

PATENT NO. : 7,119,319 B2  Page 1 of 1
APPLICATION NO. : 11/099447
DATED : October 10, 2006
INVENTOR(S) : Goro Noto et al.

It is certified that error appears in the above-identified patent and that said Letters Patent is hereby corrected as shown below:

COLUMN 4:
Line 45, "3 to 9" should read --3° to 9°--.

COLUMN 12:
Line 27, "about 17." should read --about 17°.--.
Line 34, "about 24" should read --about 24°--.

COLUMN 15:
Line 8, "3" should read --3°--.
Line 9, "9" should read --9°--.

COLUMN 19:
Line 10, "angle" should read --angles--.
Line 13, "change" should read --changes--.
Line 16, "attains" should read --attaining--.

COLUMN 21:
Line 47, "memory" should read --memory,--.

COLUMN 25:
Line 8, "describe" should read --described--.

COLUMN 27:
Line 44, "Of" should read --of--.
Line 45, "Of" should read --of--.

Signed and Sealed this

Tenth Day of July, 2007

JON W. DUDAS
*Director of the United States Patent and Trademark Office*